(12) United States Patent
Li et al.

(10) Patent No.: US 12,348,246 B2
(45) Date of Patent: Jul. 1, 2025

(54) ENCODING/DECODING METHOD, COMMUNICATION APPARATUS, AND SYSTEM

(71) Applicant: HUAWEI TECHNOLOGIES CO., LTD., Guangdong (CN)

(72) Inventors: Jiahui Li, Shenzhen (CN); Mengyao Ma, Shenzhen (CN); Junwen Xie, Shenzhen (CN); Hongliang Wei, Harbin (CN); Mingze Ding, Harbin (CN); Xiaopeng Fan, Harbin (CN); Wenbin Che, Harbin (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/505,811

(22) Filed: Nov. 9, 2023

(65) Prior Publication Data
US 2024/0072827 A1 Feb. 29, 2024

Related U.S. Application Data

(63) Continuation of application No. PCT/CN2022/092302, filed on May 11, 2022.

(30) Foreign Application Priority Data

May 12, 2021 (CN) .......................... 202110518962.6

(51) Int. Cl.
*H03M 13/00* (2006.01)
*H04L 1/00* (2006.01)
(52) U.S. Cl.
CPC ....... *H03M 13/611* (2013.01); *H03M 13/616* (2013.01); *H04L 1/0041* (2013.01)

(58) Field of Classification Search
CPC . H03M 13/611; H03M 13/616; H04L 1/0041; H04L 1/00; H04L 1/0047;
(Continued)

(56) References Cited

U.S. PATENT DOCUMENTS

2017/0093436 A1* 3/2017 Farhoodfar ....... H03M 13/2782

FOREIGN PATENT DOCUMENTS

CN 110024313 A 7/2019

OTHER PUBLICATIONS

Kurka et al., "Bandwidth-Agile Image Transmission with Deep Joint Source-Channel Coding," CoRR, submitted on Sep. 26, 2020, 2009.12480v1, 30 pages.
(Continued)

*Primary Examiner* — Thien Nguyen
(74) *Attorney, Agent, or Firm* — Fish & Richardson P.C.

(57) ABSTRACT

Example encoding/decoding methods, communication apparatus, and systems are provided. One example encoding method includes encoding first data by using an encoding model, to obtain N pieces of encoded data, where N is an integer greater than 2. De-correlation is performed on the N pieces of encoded data to obtain N pieces of de-correlated encoded data, where a part or all of the N pieces of de-correlated encoded data may be for determining second data, the second data is for restoring third data, and the third data is the first data, or an approximation degree between the third data and the first data is greater than a specified threshold The N pieces of de-correlated encoded data are sent.

20 Claims, 13 Drawing Sheets

(58) Field of Classification Search
CPC ..... H04L 1/0042; H04L 1/0084; H04L 1/009; H04N 19/132; H04N 19/154; H04N 19/156; H04N 19/17; H04N 19/89
See application file for complete search history.

(56) References Cited

OTHER PUBLICATIONS

Bourtsoulatze et al., "Deep Joint Source-Channel Coding for Wireless Image Transmission," Proceedings of IEEE Transactions on Cognitive Communications and Networking, Sep. 4, 2018, 8 pages.
International Search Report and Written Opinion in International Appln. No. PCT/CN2022/092302, mailed on Aug. 3, 2022, 15 pages (with English translation).
Extended European Search Report in European Appln. No. 22806812.8, mailed on Apr. 18, 2024, 9 pages.

* cited by examiner

ENCODING/DECODING METHOD, COMMUNICATION APPARATUS, AND SYSTEM

CROSS-REFERENCE TO RELATED APPLICATION

This application is a continuation of International Application No. PCT/CN2022/092302, filed on May 11, 2022, which claims priority to Chinese Patent Application No. 202110518962.6, filed on May 12, 2021. The disclosures of the aforementioned applications are hereby incorporated by reference in their entireties.

TECHNICAL FIELD

This application relates to the field of communication technologies, and in particular, to an encoding/decoding method, a communication apparatus, and a system.

BACKGROUND

Currently, a two-step encoding solution is usually used in a data transmission process. To be specific, to-be-transmitted data is first compressed by using a signal source encoding algorithm, to remove internal redundancy of the to-be-transmitted data and reduce an amount of information that needs to be transmitted; and then a compressed bit stream is encoded by using an error correction code. The error correction code is for enhancing a capability of resisting interference when data is transmitted on a channel, as shown in FIG. 1. An encoding apparatus encodes original data to obtain encoded data. The encoded data includes complete information of the original data, and a decoding apparatus needs to receive the encoded data completely to obtain the complete information of the original data through decoding. This requires that a bandwidth resource needed for bearing the encoded data be less than or equal to a bandwidth resource between the encoding apparatus and the decoding apparatus.

The encoding apparatus may send the encoded data to one or more decoding apparatuses. When there are a plurality of decoding apparatuses, a bandwidth resource configured for each decoding apparatus may be different. In this case, it is possible that a bandwidth resource needed for bearing encoded data is greater than a bandwidth resource configured for one or more decoding apparatuses. Consequently, the one or more decoding apparatuses cannot receive the encoded data, and cannot acquire complete information of original data. Therefore, how to implement bandwidth adaptation of the encoded data is a problem to be resolved.

SUMMARY

An objective of this application is to provide an encoding/decoding method, a communication apparatus, and a system. The method is for implementing bandwidth adaptation of encoded data.

According to a first aspect, this application provides an encoding method. The method may be performed by an encoding apparatus, or may be performed by a component (for example, a chip or a chip system) in the encoding apparatus. In the method, the encoding apparatus may encode first data by using an encoding model, to obtain N pieces of encoded data, where an output layer of the encoding model includes N nodes, each node outputs one piece of encoded data, and N is an integer greater than 2; perform de-correlation on the N pieces of encoded data to obtain N pieces of de-correlated encoded data, where a part or all of the N pieces of de-correlated encoded data are for determining second data, the second data is for restoring third data, and the third data is the first data, or an approximation degree between the third data and the first data is greater than a specified threshold; and send the N pieces of de-correlated encoded data.

A bandwidth resource is needed for transmitting each piece of encoded data. Usually, more pieces of the transmitted encoded data or a larger amount of the transmitted encoded data indicates that more bandwidth resources available for the decoding apparatus are needed. However, when a bandwidth resource of the decoding apparatus is pre-configured (for example, pre-configured by an operator) or a currently idle bandwidth resource is insufficient, the decoding apparatus cannot receive all the encoded data. Consequently, the decoding apparatus fails to receive data. In the foregoing embodiment of this application, the encoding apparatus performs de-correlation on the N pieces of encoded data to obtain the N pieces of de-correlated encoded data. The N pieces of de-correlated encoded data are independent of each other and are uncorrelated. In other words, a part of the N pieces of de-correlated encoded data may be used for obtaining third data whose approximation degree to first data is greater than or equal to a specified threshold. In this way, even if the decoding apparatus receives a part of the N pieces of de-correlated to-be-decoded data because the bandwidth resource of the decoding apparatus does not support receiving of all the N pieces of de-correlated to-be-decoded data, the third data whose approximation degree to the first data is greater than the specified threshold can be obtained, to improve a success rate of data receiving and improve a bandwidth adaptation capability of the encoded data.

In a possible design, the method may further include: receiving, by the encoding apparatus, a first parameter from the decoding apparatus, where the first parameter is for determining a loss function, the loss function is for updating the encoding model and/or a parameter that is used in processing of de-correlation, and the first parameter is determined by the decoding apparatus based on a peak signal-to-noise ratio between the first data and the third data. Further, the encoding apparatus may update, based on first information, the encoding model and/or the parameter that is used in processing of the de-correlation. The first information is determined based on the first parameter and/or a specified bandwidth resource. For example, the first parameter may satisfy: $L_M = E[w_M * P_M]$. $L_M$ is the first parameter, $E[\cdot]$ is an expected value operation, $P_M$ is the peak signal-to-noise ratio between the first data and the third data, M is a quantity of pieces of de-correlated encoded data used to determine the second data, $w_M$ is weights corresponding to different bandwidth resources, and M is an integer greater than 0 and less than or equal to N.

According to the foregoing design, the encoding apparatus may receive the first parameter determined by the decoding apparatus based on a peak signal-to-noise ratio between original data and reconstructed data, and update the encoding model, update a parameter that is used in processing of de-correlation, or update the encoding model and a parameter that is used in processing of de-correlation based on the first parameter and/or a specified bandwidth resource. The peak signal-to-noise ratio measures a ratio of a maximum possible power of the original data to a noise power of the reconstructed data, and can well reflect a real status of the reconstructed data. Therefore, the encoding apparatus updates, based on the peak signal-to-noise ratio, the encoding model and the parameter that is used in processing of the de-correlation, and can optimize encoding performance of the encoding model and the processing of the de-correlation of the encoding apparatus, for example, reduce a problem such as an excessive degree of de-correlation or an insufficient degree of de-correlation. The specified bandwidth resource can further improve the bandwidth adaptation capability of the encoded data.

In a possible design, before the sending the N pieces of de-correlated encoded data, the encoding apparatus may further send a pilot signal of the N pieces of de-correlated encoded data.

According to the foregoing design, the encoding apparatus sends the pilot signal of the N pieces of de-correlated encoded data to the decoding apparatus, so that the decoding apparatus may obtain, based on the pilot signal, channel state information in a process of transmitting de-correlated encoded data, and perform de-noising processing based on the channel state information and received de-correlated encoded data, to improve a channel adaptation capability of encoded data.

In a possible design, that the encoding apparatus performs de-correlation on the N pieces of encoded data to obtain N pieces of de-correlated encoded data may be: performing, by the encoding apparatus, non-linear transformation on characteristic information of the N pieces of encoded data, to obtain N pieces of non-linearly transformed characteristic information; determining a correlation coefficient matrix of the N pieces of encoded data based on the N pieces of non-linearly transformed characteristic information and the characteristic information of the N pieces of encoded data; and determining the N pieces of de-correlated encoded data based on the N pieces of non-linearly transformed characteristic information, the characteristic information of the N pieces of encoded data, and the correlation coefficient matrix.

In a possible design, the determining, by the encoding apparatus, the N pieces of de-correlated encoded data based on the N pieces of non-linearly transformed characteristic information, the characteristic information of the N pieces of encoded data, and the correlation coefficient matrix may be: The encoding apparatus may perform a mask operation on the correlation coefficient matrix to obtain a masked correlation coefficient matrix; determine the correlated characteristic information of the N pieces of encoded data based on the N pieces of non-linearly transformed characteristic information and the masked correlation coefficient matrix; and perform a difference operation on the characteristic information of the N pieces of encoded data and the correlated characteristic information of the N pieces of encoded data, to obtain the N pieces of de-correlated encoded data.

In a possible design, the N pieces of encoded data consist of first encoded data and second encoded data. That the encoding apparatus performs de-correlation on the N pieces of encoded data to obtain N pieces of de-correlated encoded data may be: The encoding apparatus may determine correlated characteristic information between the first encoded data and the second encoded data based on the characteristic information of the first encoded data and the characteristic information of the second encoded data; and perform a difference operation on the characteristic information of the first encoded data and the correlated characteristic information between the first encoded data and the second encoded data, to obtain the de-correlated first encoded data.

In a possible design, the determining, by the encoding apparatus, the correlated characteristic information between the first encoded data and the second encoded data based on the characteristic information of the first encoded data and the characteristic information of the second encoded data may be: separately performing, by the encoding apparatus, a convolution operation on the characteristic information of the first encoded data and the characteristic information of the second encoded data, to obtain the characteristic information of the first encoded data after the convolution operation and the characteristic information of the second encoded data after the convolution operation; performing an inner product operation on the characteristic information of the first encoded data after the convolution operation and the characteristic information of the second encoded data after the convolution operation, to obtain a correlation coefficient matrix between the first encoded data and the second encoded data; and performing a convolution operation on the correlation coefficient matrix and the characteristic information of the second encoded data, to obtain correlated characteristic information between the first encoded data and the second encoded data.

According to a second aspect, this application provides a decoding method. The method may be performed by a decoding apparatus, or may be performed by a component (for example, a chip or a chip system) in the decoding apparatus. In the method, the decoding apparatus receives M pieces of N pieces of de-correlated to-be-decoded data from an encoding apparatus based on a data receiving capability, where the N pieces of de-correlated to-be-decoded data are obtained by the encoding apparatus, by performing de-correlation on the N pieces of encoded data after the encoding apparatus encodes first data by using an encoding model to obtain N pieces of encoded data, where an output layer of the encoding model includes N nodes, each node outputs one piece of encoded data, N is an integer greater than 2, and M is an integer greater than 0 and less than or equal to N; obtains reconstructed N pieces of to-be-decoded data based on the M pieces of de-correlated to-be-decoded data; and decodes the reconstructed N pieces of to-be-decoded data by using a decoding model, to obtain second data, where the second data is for restoring third data, and the third data is the first data, or an approximation degree between the third data and the first data is greater than a specified threshold.

In a possible design, the data receiving capability includes a bandwidth resource that can be used by the decoding apparatus.

In a possible design, the method may further include: restoring, by the decoding apparatus, the third data by using the second data; and determining a first parameter based on a peak signal-to-noise ratio between the first data and the third data, where the first parameter is for determining a loss function, and the loss function is for updating the decoding model and/or a parameter that is used in processing of obtaining the reconstructed N pieces of to-be-decoded data.

In a possible design, the decoding apparatus may further send the first parameter to the encoding apparatus.

In a possible design, the decoding apparatus may further update, based on second information, the decoding model and/or the parameter that is used in processing of obtaining the reconstructed N pieces of to-be-decoded data. The second information is determined based on the first parameter and/or a specified bandwidth resource. For example, the first parameter may satisfy: $L_M = E[w_M * P_M]$. $L_M$ is the first parameter, $E[\cdot]$ is an expected value operation, $P_M$ is the peak signal-to-noise ratio between the first data and the third data, and $w_M$ is weights corresponding to different bandwidth resources.

In a possible design, before obtaining the reconstructed N pieces of to-be-decoded data, the decoding apparatus may further receive a pilot signal of the M pieces of de-correlated to-be-decoded data from the encoding apparatus; determine channel state information based on the pilot signal; and obtain M pieces of de-noising and de-correlated to-be-decoded data by using a deconvolutional neural network model and the channel state information.

In a possible design, that the decoding apparatus obtains reconstructed N pieces of to-be-decoded data based on the M pieces of de-correlated to-be-decoded data may be: obtaining, by the decoding apparatus, characteristic information of initialized N pieces of de-correlated to-be-decoded data based on characteristic information of the M pieces of de-correlated to-be-decoded data; and obtaining a correlation coefficient between the characteristic information of the initialized N pieces of the de-correlated to-be-decoded data, to obtain a reconstructed correlation coefficient matrix; and obtaining the reconstructed N pieces of to-be-decoded data based on the characteristic information of the initialized N pieces of de-correlated to-be-decoded data and the reconstructed correlation system matrix.

In a possible design, the obtaining, by the decoding apparatus, the reconstructed N pieces of to-be-decoded data based on the characteristic information of the initialized N pieces of de-correlated to-be-decoded data and the reconstructed correlation system matrix may be: performing, by the decoding apparatus, a multiplication operation on the characteristic information of the initialized N pieces of to-be-decoded data and the reconstructed correlation coefficient matrix, to obtain correlated characteristic information of the reconstructed N pieces of to-be-decoded data; and performing a summation operation on the characteristic information of the initialized N pieces of de-correlated to-be-decoded data and the correlated characteristic information of the reconstructed N pieces of to-be-decoded data, to obtain the reconstructed N pieces of to-be-decoded data.

According to a third aspect, this application provides a communication apparatus. The communication apparatus includes an encoder and a transceiver. The encoder may be configured to encode first data by using an encoding model, to obtain N pieces of encoded data, where an output layer of the encoding model includes N nodes, each node outputs one piece of encoded data, and N is an integer greater than 2; and perform de-correlation on the N pieces of encoded data to obtain N pieces of de-correlated encoded data, where a part or all of the N pieces of de-correlated encoded data are for determining second data, the second data is for restoring third data, and the third data is the first data, or an approximation degree between the third data and the first data is greater than a specified threshold. The transceiver may be configured to send the N pieces of de-correlated encoded data.

In a possible design, the transceiver is further configured to receive a first parameter from a decoding apparatus. The first parameter is for determining a loss function, the loss function is for updating the encoding model and/or a parameter that is used in processing of de-correlation, and the first parameter is determined by the decoding apparatus based on a peak signal-to-noise ratio between the first data and the third data.

In a possible design, the encoder is further configured to update, based on first information, the encoding model and/or the parameter that is used in processing of the de-correlation. The first information is determined based on the first parameter and/or a specified bandwidth resource. For example, the first parameter may satisfy: $L_M = E[w_M * P_M]$. $L_M$ is the first parameter, $E[\cdot]$ is an expected value operation, $P_M$ is the peak signal-to-noise ratio between the first data and the third data, M is a quantity of pieces of de-correlated encoded data used to determine the second data, $w_M$ is weights corresponding to different bandwidth resources, and M is an integer greater than 0 and less than or equal to N.

In a possible design, before sending the N pieces of de-correlated encoded data, the transceiver is further configured to send a pilot signal of the N pieces of de-correlated encoded data.

In a possible design, the encoder is specifically configured to: perform non-linear transformation on characteristic information of the N pieces of encoded data, to obtain N pieces of non-linearly transformed characteristic information; determine a correlation coefficient matrix of the N pieces of encoded data based on the N pieces of non-linearly transformed characteristic information and the characteristic information of the N pieces of encoded data; and determine the N pieces of de-correlated encoded data based on the N pieces of characteristic information after the nonlinear transform, the characteristic information of the N pieces of encoded data, and the correlation coefficient matrix.

In a possible design, the encoder is specifically configured to: perform a mask operation on the correlation coefficient matrix to obtain a masked correlation coefficient matrix; determine correlated characteristic information of the N pieces of encoded data based on the N pieces of non-linearly transformed characteristic information and the masked correlation coefficient matrix; and perform a difference operation on the characteristic information of the N pieces of encoded data and the correlated characteristic information of the N pieces of encoded data, to obtain the N pieces of de-correlated encoded data.

In a possible design, the N pieces of encoded data consist of first encoded data and second encoded data; and the encoder is specifically configured to: determine correlated characteristic information between the first encoded data and the second encoded data based on characteristic information of the first encoded data and characteristic information of the second encoded data; and perform a difference operation on the characteristic information of the first encoded data and the correlated characteristic information between the first encoded data and the second encoded data to obtain de-correlated first encoded data.

In a possible design, the encoder is specifically configured to: separately perform a convolution operation on the characteristic information of the first encoded data and the characteristic information of the second encoded data, to obtain the characteristic information of the first encoded data after the convolution operation and the characteristic information of the second encoded data after the convolution operation; perform an inner product operation on the characteristic information of the first encoded data after the convolution operation and the characteristic information of the second encoded data after the convolution operation, to obtain a correlation coefficient matrix between the first encoded data and the second encoded data; and perform a convolution operation on the correlation coefficient matrix and the characteristic information of the second encoded data to obtain correlated characteristic information between the first encoded data and the second encoded data.

According to a fourth aspect, this application provides a communication apparatus. The communication apparatus includes a decoder and a transceiver. The transceiver may be configured to receive M pieces of N pieces of de-correlated to-be-decoded data from an encoding apparatus based on a data receiving capability. The N pieces of de-correlated to-be-decoded data are obtained by the encoding apparatus, by performing de-correlation on the N pieces of encoded data after the encoding apparatus encodes first data by using an encoding model to obtain N pieces of encoded data, where an output layer of the encoding model includes N nodes, each node outputs one piece of encoded data, N is an integer greater than 2, and M is an integer greater than 0 and less than or equal to N. The decoder may be configured to: obtain the reconstructed N pieces of to-be-decoded data based on the M pieces of de-correlated to-be-decoded data; and decode the reconstructed N pieces of to-be-decoded data by using a decoding model, to obtain second data, where the second data is for restoring third data, and the third data is the first data, or an approximation degree between the third data and the first data is greater than a specified threshold.

In a possible design, the data receiving capability includes a bandwidth resource that can be used by the decoding apparatus.

In a possible design, the decoder is specifically configured to: restore the third data by using the second data; and determine a first parameter based on a peak signal-to-noise ratio between the first data and the third data, where the first parameter is for determining a loss function, and the loss function is for updating the decoding model and/or a parameter that is used in processing of obtaining the reconstructed N pieces of to-be-decoded data.

In a possible design, the transceiver is further configured to send the first parameter to the encoding apparatus.

In a possible design, the decoder is further configured to update, based on second information, the decoding model and/or the parameter that is used in processing of obtaining the reconstructed N pieces of to-be-decoded data. The second information is determined based on the first parameter and/or a specified bandwidth resource. For example, the first parameter may satisfy: $L_M=E[w_M*P_M]$. $L_M$ is the first parameter, $E[·]$ an expected value operation, $P_M$ is the peak signal-to-noise ratio between the first data and the third data, and $w_M$ is weights corresponding to different bandwidth resources.

In a possible design, before obtaining the reconstructed N pieces of to-be-decoded data, the transceiver is further configured to receive a pilot signal of the M pieces of de-correlated to-be-decoded data from the encoding apparatus; and the decoder is further configured to determine channel state information based on the pilot signal; and obtain M pieces of de-noising and de-correlated to-be-decoded data by using a deconvolutional neural network model and the channel state information.

In a possible design, the decoder is specifically configured to: obtain characteristic information of initialized N pieces of de-correlated to-be-decoded data based on characteristic information of the M pieces of de-correlated to-be-decoded data; obtain a correlation coefficient between the characteristic information of the initialized N pieces of the de-correlated to-be-decoded data, to obtain a reconstructed correlation coefficient matrix; and obtain the reconstructed N pieces of to-be-decoded data based on the characteristic information of the initialized N pieces of de-correlated to-be-decoded data and the reconstructed correlation system matrix.

In a possible design, the decoder is specifically configured to: perform a multiplication operation on the characteristic information of the initialized N pieces of to-be-decoded data and the reconstructed correlation coefficient matrix, to obtain correlated characteristic information of the reconstructed N pieces of to-be-decoded data; and perform a summation operation on the characteristic information of the initialized N pieces of de-correlated to-be-decoded data and the correlated characteristic information of the reconstructed N pieces of to-be-decoded data, to obtain the reconstructed N pieces of to-be-decoded data.

According to a fifth aspect, this application provides a communication apparatus, including a logic circuit and an input/output interface circuit. The logic circuit may be configured to encode first data by using an encoding model, to obtain N pieces of encoded data, where an output layer of the encoding model includes N nodes, each node outputs one piece of encoded data, and N is an integer greater than 2; and perform de-correlation on the N pieces of encoded data to obtain N pieces of de-correlated encoded data, and perform the method according to any design of the first aspect. A part or all of the N pieces of de-correlated encoded data are for determining second data, the second data is for restoring third data, and the third data is the first data, or an approximation degree between the third data and the first data is greater than a specified threshold. The input/output interface circuit is configured to send the N pieces of de-correlated encoded data.

According to a sixth aspect, this application provides a communication apparatus, including an input/output interface circuit and a logic circuit. The input/output interface circuit is configured to receive M pieces of N pieces of de-correlated to-be-decoded data from an encoding apparatus based on a data receiving capability. The N pieces of de-correlated to-be-decoded data are obtained by the encoding apparatus, by performing de-correlation on the N pieces of encoded data after the encoding apparatus encodes first data by using an encoding model to obtain N pieces of encoded data, where an output layer of the encoding model includes N nodes, each node outputs one piece of encoded data, N is an integer greater than 2, and M is an integer greater than 0 and less than or equal to N. The logic circuit is configured to: obtain reconstructed N pieces of to-be-decoded data based on the M pieces of de-correlated to-be-decoded data; and decode the reconstructed N pieces of to-be-decoded data by using a decoding model, to obtain second data, and perform the method according to any design of the second aspect. The second data is for restoring third data, and the third data is second data, or an approximation degree between the second data and the first data is greater than a specified threshold.

According to a seventh aspect, a communication apparatus is provided, including a memory and one or more processors. The memory is configured to store a program. The one or more processors are configured to execute the program stored in the memory, and when the program is executed, the communication apparatus is enabled to perform the method according to any design in the first aspect, or perform the method according to any design in the second aspect.

In a possible design, the processor includes a memory.

In a possible design, the communication apparatus may be a chip or an integrated circuit.

According to an eighth aspect, this application provides a communication system, including an encoding apparatus configured to perform the method according to any design of the first aspect, and/or a decoding apparatus configured to perform the method according to any design of the second aspect.

According to a ninth aspect, this application provides a computer-readable storage medium. The computer-readable storage medium stores computer-readable instructions, and when the computer-readable instructions are run on a communication apparatus, the communication apparatus is enabled to perform the method according to any design of the first aspect or perform the method according to any design of the second aspect.

According to a tenth aspect, this application provides a computer program product. When the computer program product runs on a communication apparatus, the communication apparatus is enabled to perform the method according to any design of the first aspect or the method according to any design of the second aspect.

According to an eleventh aspect, a chip system is provided. The chip system includes a processor, and may further include a memory, configured to implement the method according to any design of the first aspect or the method according to any design of the second aspect. The chip system may include a chip, or may include a chip and another discrete component.

For beneficial effects of the method according to any one of the possible designs of the second aspect to the eleventh aspect, refer to beneficial effects of the method according to the first aspect and the possible designs of the first aspect.

DESCRIPTION OF EMBODIMENTS

Figure 1:
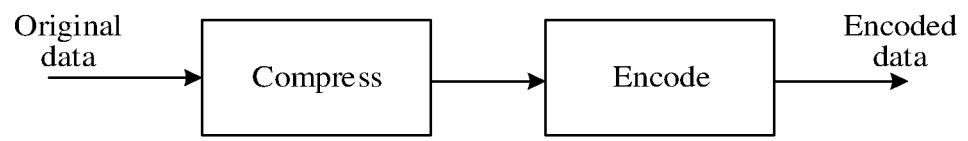
FIG. 1 is a schematic diagram of an encoding solution according to an embodiment of this application.

Embodiments of this application provide an encoding/decoding method, a communication apparatus, and a system. The method and the apparatus are based on a same technical concept. Because a problem-resolving principle of the method is similar to that of the apparatus, mutual reference may be made to implementations of the apparatus and the method. Repeated parts are not described in detail again. In descriptions of embodiments of this application, the term "and/or" describes an association relationship between associated objects and indicates that three relationships may exist. For example, A and/or B may indicate the following three cases: Only A exists, both A and B exist, and only B exists. The character "/" generally indicates an "or" relationship between the associated objects. In this application, "at least one" means one or more, and "a plurality of" means two or more.

First, some terms in embodiments of this application are described.

(1) A server may also be referred to as a big data platform, a cloud, a cloud server, a server cluster, or the like. This name is not limited in this application. However, this does not constitute a limitation on the server, and another server that can be used for big data computing may also be used.

(2) A network device may also be referred to as a radio access network device, and may be a base station (base station), an eNodeB, a transmission reception point (transmission reception point, TRP), a gNB, a next-generation base station in a 6th generation (6G) mobile communication system, a base station in a future mobile communication system, an access node in a Wi-Fi system, or the like; or may be a module or a unit that completes a part of a function of a base station, for example, may be a central unit (CU), or may be a distributed unit (DU). The radio access network device may be a macro base station, a micro base station, an indoor base station, or the like. Alternatively, the network device may be another network device that has a forwarding function, such as a switch or a router. A specific technology and a specific device form used by the network device are not limited in embodiments of this application.

(3) A terminal device may also be referred to as a terminal, a user equipment (UE), a mobile station, a mobile terminal, or the like. The terminal may be widely used in various scenarios such as device-to-device (D2D), vehicle to everything (V2X) communication, machine type communication (MTC), interne of things (IoT), virtual reality, augmented reality, industrial control, autonomous driving, telemedicine, smart grid, smart furniture, smart office, smart wearable, smart transportation, and smart city. The terminal may be a mobile phone, a tablet computer, a computer having a wireless transceiver function, a wearable device, a vehicle, an uncrewed aerial vehicle, a helicopter, an airplane, a ship, a robot, a robot arm, a smart home device, or the like. A specific technology and a specific device form used by the terminal are not limited in embodiments of this application.

In addition, unless otherwise stated, ordinal numbers such as "first", "second", and "third" in embodiments of this application are for distinguishing between a plurality of objects, and are not intended to limit sizes, content, a sequence, a time sequence, priorities, importance degrees, or the like of the plurality of objects. For example, first information, second information, and third information are merely used to distinguish between different information, and do not indicate different sizes, different content, different sending sequences, different priorities, different importance degrees, or the like of the three pieces of information. In addition, terms "include", "have" and any other variants thereof mean to cover non-exclusive inclusion. For example, a process, a method, a system, a product, or a device that includes a list of steps or units is not necessarily limited to those steps or units that are expressly listed, but may include other steps or units that are not expressly listed or inherent to the process, the method, the product, or the device.

The encoding/decoding method provided in embodiments of this application may be applied to a 5th generation (5G) communication system, for example, a 5G new radio (NR) system, a device to device (D2D) communication system, a Bluetooth communication system, and a Wi-Fi communication system, or may be applied to various future communication systems.

The following describes a communication system to which embodiments of this application are applied.

Figure 2:
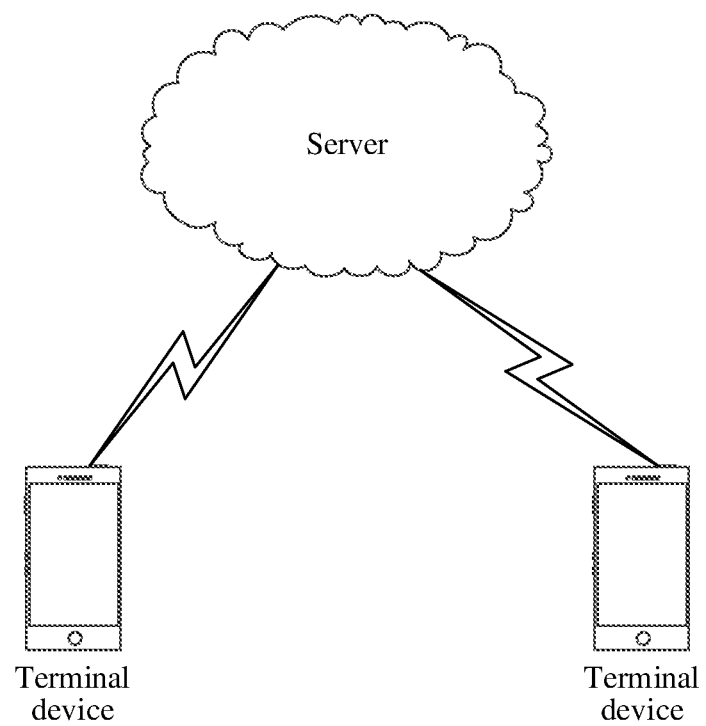
FIG. 2 is a schematic diagram of a communication system to which an embodiment of this application is applicable.

FIG. 2 is a schematic diagram of a communication system to which an embodiment of this application is applicable. As shown in FIG. 2, the communication system includes a server and one or more terminal devices (two terminal devices are used as an example in FIG. 2). After a connection is established between the server and a terminal device, the server may provide a network service for the terminal device. For example, the server may be used as an encoding apparatus, and the terminal device may be used as a decoding apparatus. For descriptions of the server and the terminal device, refer to the foregoing descriptions.

In an example, a large amount of data is maintained in the server such as image data, video data, or audio data. For example, the server may obtain data 1, encode the data 1 to obtain encoded data, and then send the encoded data to the one or more terminal devices. After receiving to-be-decoded data, the one or more terminal devices decode the to-be-decoded data to obtain the data 1.

In another example, the terminal device may send a request message for obtaining data 1 to the server. Correspondingly, after receiving the request message, the server obtains the data 1, encodes the data 1 to obtain encoded data, and sends a response message to the terminal device. The response message includes the encoded data. After receiving the response message, the terminal device decodes to-be-decoded data (namely, encoded data on the server side) to obtain the data 1.

It may be understood that the server may send the encoded data to one terminal device in a unicast manner, or may send the encoded data to a plurality of terminal devices in a multicast manner or a broadcast manner. This is not limited in this embodiment of this application.

Figure 3:
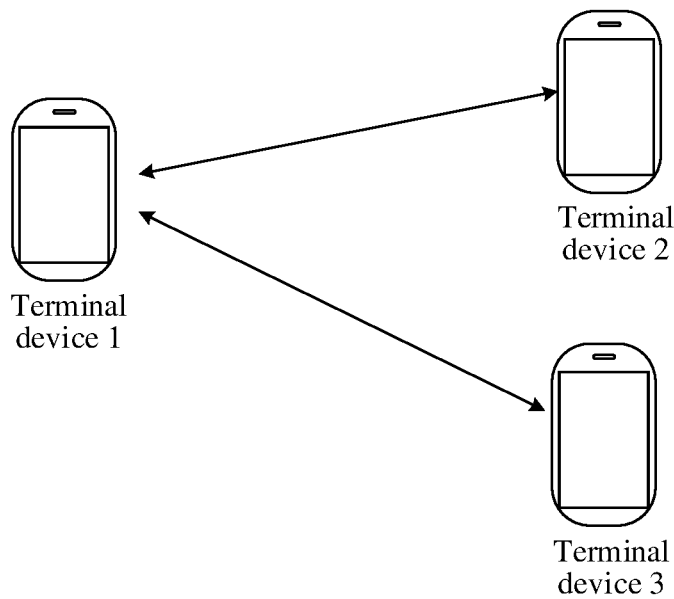
FIG. 3 is another schematic diagram of a communication system to which an embodiment of this application is applicable.

For another example, if the technical solutions provided in embodiments of this application are applied to a V2X communication scenario, FIG. 3 is an application scenario according to an embodiment of this application. FIG. 3 includes a terminal device 1, a terminal device 2, and a terminal device 3. The terminal device 1 may communicate with the terminal device 2 and the terminal device 3 through a sidelink (SL). For example, the terminal device 1 may be used as an encoding apparatus, and the terminal device 2 and the terminal device 3 may be used as decoding apparatuses. For example, the terminal device 1 may encode data 1 to obtain encoded data, and then send the encoded data to the terminal device 2 and the terminal device 3. After receiving to-be-decoded data, the terminal device 2 and the terminal device 3 may decode the to-be-decoded data to obtain the data 1.

Figure 4:
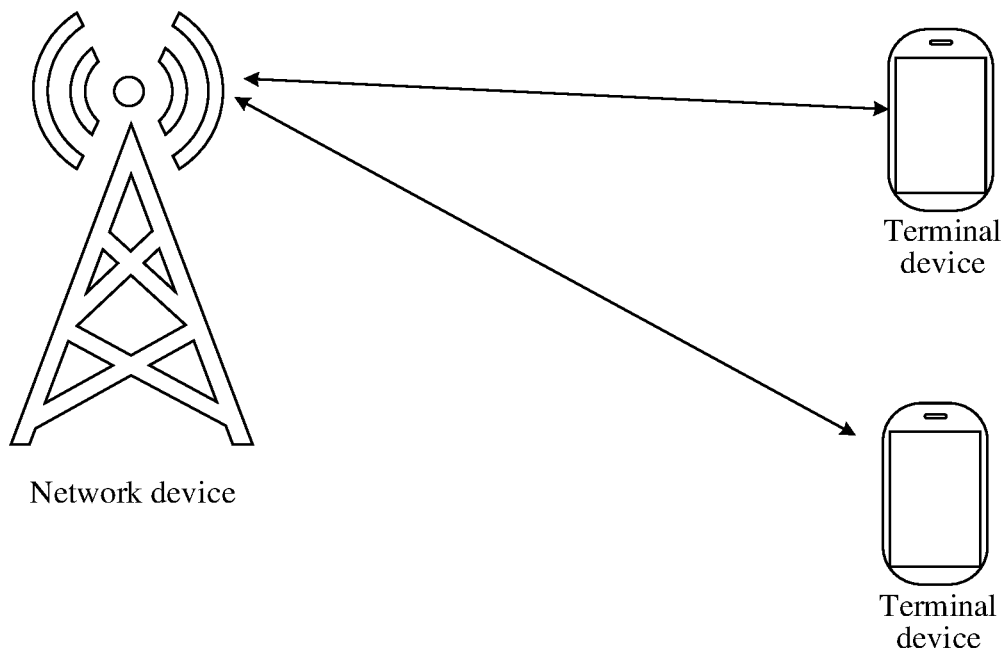
FIG. 4 is still another schematic diagram of a communication system to which an embodiment of this application is applicable.

For still another example, if the technical solutions provided in embodiments of this application are applied to communication of a Uu interface in an LTE system or an NR system, FIG. 4 is an application scenario according to an embodiment of this application. FIG. 4 includes a network device and one or more terminal devices (two terminal devices are used as an example in FIG. 4). The network device may communicate with the one or more terminal devices through a Uu interface. For example, the network device may be used as an encoding apparatus, and the one or more terminal devices may be used as a decoding apparatus. For example, the network device may encode data 1 to obtain encoded data, and then send the encoded data to the one or more terminal devices. After receiving to-be-decoded data, the one or more terminal devices may decode the to-be-decoded data to obtain the data 1.

In FIG. 2, FIG. 3, and FIG. 4, for example, the terminal device is a mobile phone. The terminal device in embodiments of this application is not limited thereto.

With reference to the accompanying drawings, the following describes the technical solutions provided in embodiments of this application.

Figure 5:
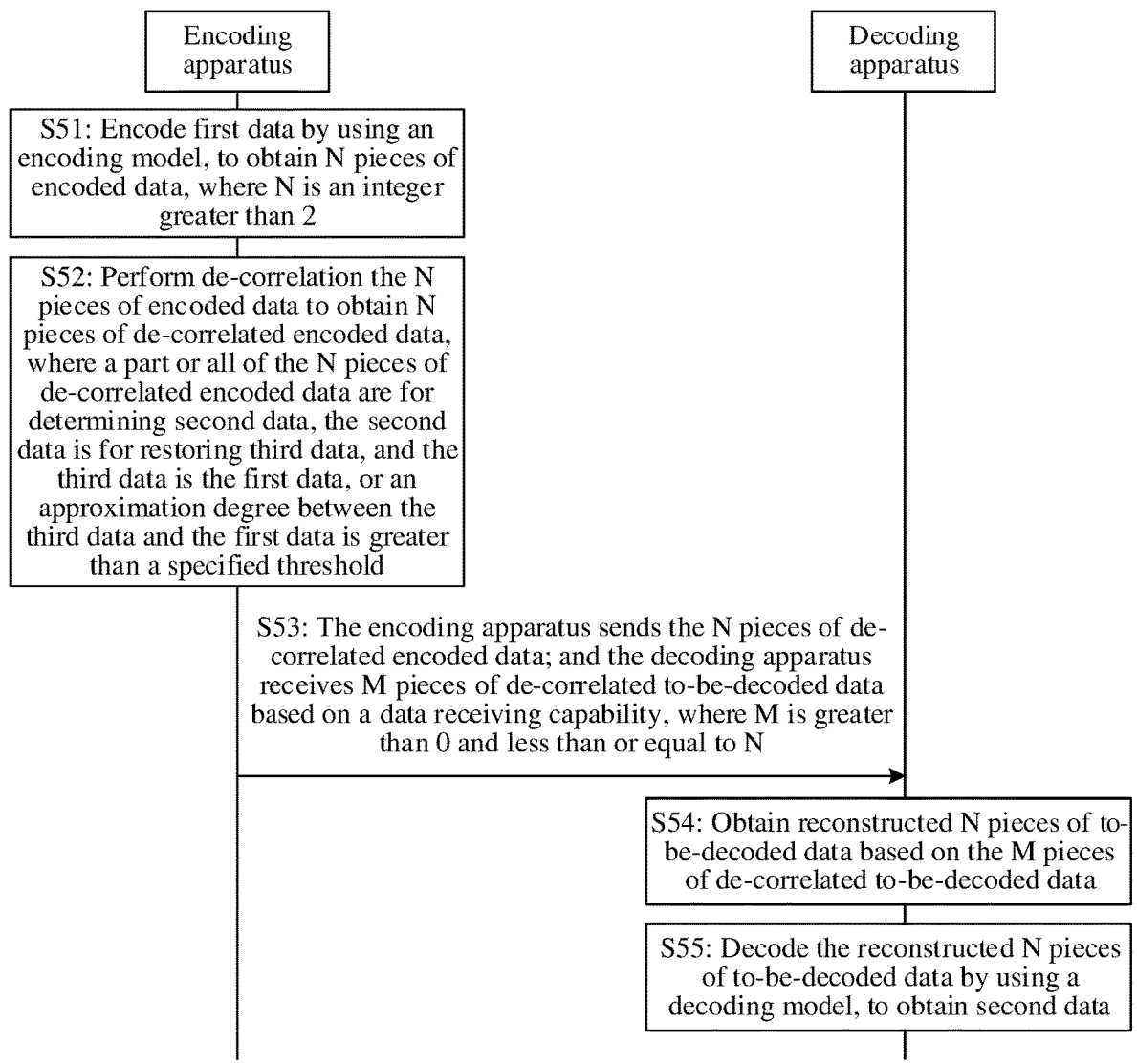
FIG. 5 is a schematic flowchart of an encoding/decoding method according to an embodiment of this application.

FIG. 5 is a schematic flowchart of an encoding/decoding method according to an embodiment of this application. In the following description process, an example in which the method is applied to a communication system shown in any one of FIG. 2 to FIG. 4 is used.

For ease of description, an example in which the method is performed by an encoding apparatus and a decoding apparatus is used in the following descriptions. In a possible scenario, if this embodiment is applied to the communication system shown in FIG. 2, the encoding apparatus described below may be the server shown in FIG. 2, and the decoding apparatus described below may be the terminal device shown in FIG. 2. Alternatively, if this embodiment is applied to the communication system shown in FIG. 3, the encoding apparatus described below may be the network device shown in FIG. 3, and the decoding apparatus described below may be the terminal device shown in FIG. 3. Alternatively, if this embodiment is applied to the communication system shown in FIG. 4, the encoding apparatus described below may be the terminal device 1 shown in FIG. 4, and the decoding apparatus described below may be the terminal device 2, the terminal device 3 or the terminal device 2 and the terminal device 3 shown in FIG. 4. It should be understood that the following content implemented by the encoding apparatus may alternatively be implemented by a component (for example, a chip or a chip system) of the encoding apparatus. Similarly, the following content implemented by the decoding apparatus may alternatively be implemented by a component (for example, a chip or a chip system) of the decoding apparatus.

S51: The encoding apparatus encodes first data by using an encoding model, to obtain N pieces of encoded data.

N is a positive integer greater than 2. The first data may be data such as image data, audio data, video data, or the like. A specific form of the first data is not limited in this embodiment of this application. It may be understood that a to-be-encoded object of the encoding apparatus may be data, information, or the like. The to-be-encoded object is not limited in this embodiment of this application. For ease of understanding, an example in which the to-be-encoded object is data is used for description in this embodiment of this application.

For example, the encoding apparatus may obtain the first data, and then encode the first data by using the encoding model, to obtain the N pieces of encoded data. For example, the encoding apparatus may actively obtain the first data. For example, after data is updated, the encoding apparatus may actively push updated data to the decoding apparatus. For another example, the encoding apparatus may obtain the first data after receiving a request message from the decoding apparatus and used to request the first data.

There may be one or more encoding models, for example, one or more models constructed based on a convolutional neural network. An input of the encoding model is the first data, and an output is the N pieces of encoded data. For example, each piece of encoded data corresponds to 1/N output of the convolutional neural network. In other words, an output layer of the encoding model may include N nodes, and each node outputs one piece of encoded data. In other words, each output layer independently outputs one piece of corresponding encoded data, to form the N pieces of encoded data. The N pieces of encoded data may be obtained by evenly allocating encoded data of the first data. In other words, sizes of the N pieces of encoded data are the same. Correspondingly, each of the N pieces of encoded data needs a same bandwidth resource.

For example, the first data is the image data. The encoding apparatus may standardize a pixel value of the image data, for example, standardize the pixel value to an interval of [0, 1], sample and extract characteristics from standardized image data, and evenly divide extracted characteristic information into N pieces, in other words, to obtain the N pieces of encoded data. For example, each piece of encoded data corresponds to 1/N output of the convolutional neural network.

S52: The encoding apparatus de-correlates the N pieces of encoded data, to obtain N pieces of de-correlated encoded data.

The encoding apparatus may de-correlate the N pieces of encoded data, for example, de-correlate any two of the N pieces of encoded data, to obtain N pieces of de-correlated encoded data. De-correlation performed on the N pieces of encoded data may be understood as removing a correlated characteristic between the N pieces of encoded data, so that the N pieces of de-correlated encoded data are independent of each other and are uncorrelated.

A part or all of the N pieces of de-correlated encoded data may be for determining second data. The second data may be for restoring third data, and the third data is the first data, or an approximation degree between the third data and the first data is greater than or equal to a specified threshold. That the approximation degree between the third data and the first data is greater than or equal to the specified threshold may be understood as that the first data and the third data are relatively close or infinitely close, or the like. It should be understood that the third data may be the second data, or may be data obtained after further processing is performed on the second data. For example, the image data is used as an example. After obtaining decoded data (namely, the second data), the decoding apparatus may further perform image processing such as image rendering on the decoded data, to obtain reconstructed image data (namely, the third data).

For example, when all of the N pieces of de-correlated encoded data are for determining the second data, third data restored from the second data may be the same as the first data, or the approximation degree between the third data and the first data is greater than or equal to the specified threshold. For another example, when a part of the N pieces of de-correlated encoded data are for determining the second data, the approximation degree between third data restored from the second data and the first data is greater than or equal to the specified threshold. Because the N pieces of de-correlated encoded data are independent of each other and are uncorrelated, one or more pieces of the N pieces of de-correlated encoded data may be for restoring the third data whose approximation degree to the first data is greater than or equal to the specified threshold. For example, the first data is the image data (or the video data), and the second data is determined by a part of the N pieces of de-correlated encoded data. In this case, the third data restored from the second data may be lower in image quality than the first data. For example, a resolution or a color degree of a picture is reduced. However, the third data includes complete image information of the first data, and user experience is not affected. The specified threshold may be predefined, or may be obtained by using a large amount of data. This is not limited in this embodiment of this application.

It should be noted that a larger quantity of pieces of de-correlated encoded data used to determine the second data indicates that the third data restored from the second data is closer to the first data in quality. The third data is lower in quality than the first data. However, the second data includes complete image information of the first data, and user experience is not affected. It may be understood that a resolution capability (such as a visual resolution capability or an auditory capability) of a user is limited. To be specific, the resolution capability of the user supports a specific error rate. The third data includes the complete information of the first data. Even if quality of the third data is lower than that of the first data, an error rate between the third data and the second data is within an error rate supported by the resolution capability of the user. In other words, the user cannot intuitively perceive a difference between the first data and the third data. Therefore, user experience is not affected.

Embodiments of this application provide two de-correlation methods. The following separately describes the two methods. It should be understood that embodiments of this application are not limited thereto.

EXAMPLE 1

Figure 6:
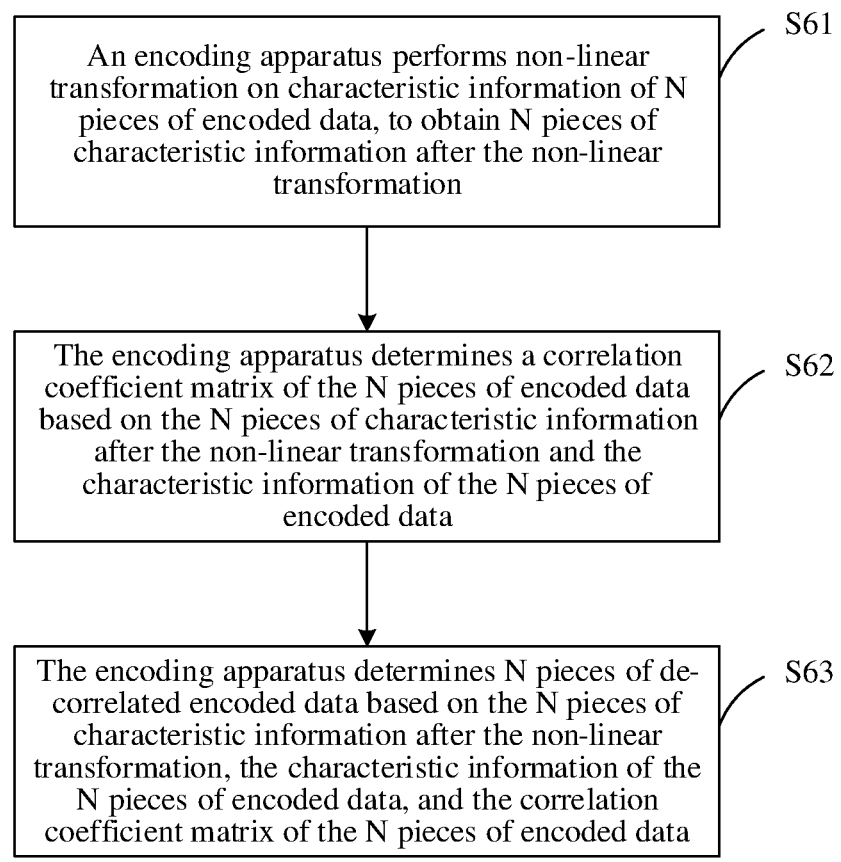
FIG. 6 is a schematic flowchart of a de-correlation method according to an embodiment of this application.

FIG. 6 is a schematic flowchart of a de-correlation method according to an embodiment of this application.

S61: An encoding apparatus performs non-linear transformation on characteristic information of N pieces of encoded data, to obtain N pieces of non-linearly transformed characteristic information.

The encoding apparatus may perform the non-linear transformation on the characteristic information of the N pieces of encoded data by using a residual block model. For example, the encoding apparatus inputs characteristic information of each of the N pieces of encoded data into one residual block model, to obtain a non-linear representation of the characteristic information of each piece of encoded data, in other words, to obtain the N pieces of non-linearly transformed characteristic information. Convolution layer coefficients of N residual block models corresponding to the characteristic information of the N pieces of encoded data are independent of each other. Optionally, the residual block model may include two convolution layers. However, this embodiment of this application is not limited thereto.

S62: The encoding apparatus determines a correlation coefficient matrix of the N pieces of encoded data based on the N pieces of non-linearly transformed characteristic information and the characteristic information of the N pieces of encoded data.

For example, the encoding apparatus may perform an inner product operation on the N pieces of non-linearly transformed characteristic information and the characteristic information of the N pieces of encoded data, to obtain a correlation coefficient matrix of the N pieces of encoded data. For example, N is 6, and the correlation coefficient matrix of the N pieces of encoded data may satisfy a formula (1).

$$\text{Correlation} = \begin{bmatrix} \rho_{11} & \rho_{21} & \rho_{31} & \rho_{41} & \rho_{51} & \rho_{61} \\ \rho_{12} & \rho_{22} & \rho_{32} & \rho_{42} & \rho_{52} & \rho_{62} \\ \rho_{13} & \rho_{23} & \rho_{33} & \rho_{43} & \rho_{53} & \rho_{63} \\ \rho_{14} & \rho_{24} & \rho_{34} & \rho_{44} & \rho_{54} & \rho_{64} \\ \rho_{15} & \rho_{25} & \rho_{35} & \rho_{45} & \rho_{55} & \rho_{65} \\ \rho_{16} & \rho_{26} & \rho_{36} & \rho_{46} & \rho_{56} & \rho_{66} \end{bmatrix} \quad (1)$$

Correlation represents the correlation coefficient matrix of the N pieces of encoded data, and $\rho_{ij}$ represents a correlation coefficient between an $i^{th}$ piece of non-linearly transformed characteristic information and characteristic information of a $j^{th}$ piece of encoded data.

S63: The encoding apparatus determines N pieces of de-correlated encoded data based on the N pieces of non-linearly transformed characteristic information, the characteristic information of the N pieces of encoded data, and the correlation coefficient matrix of the N pieces of encoded data.

Figure 7:
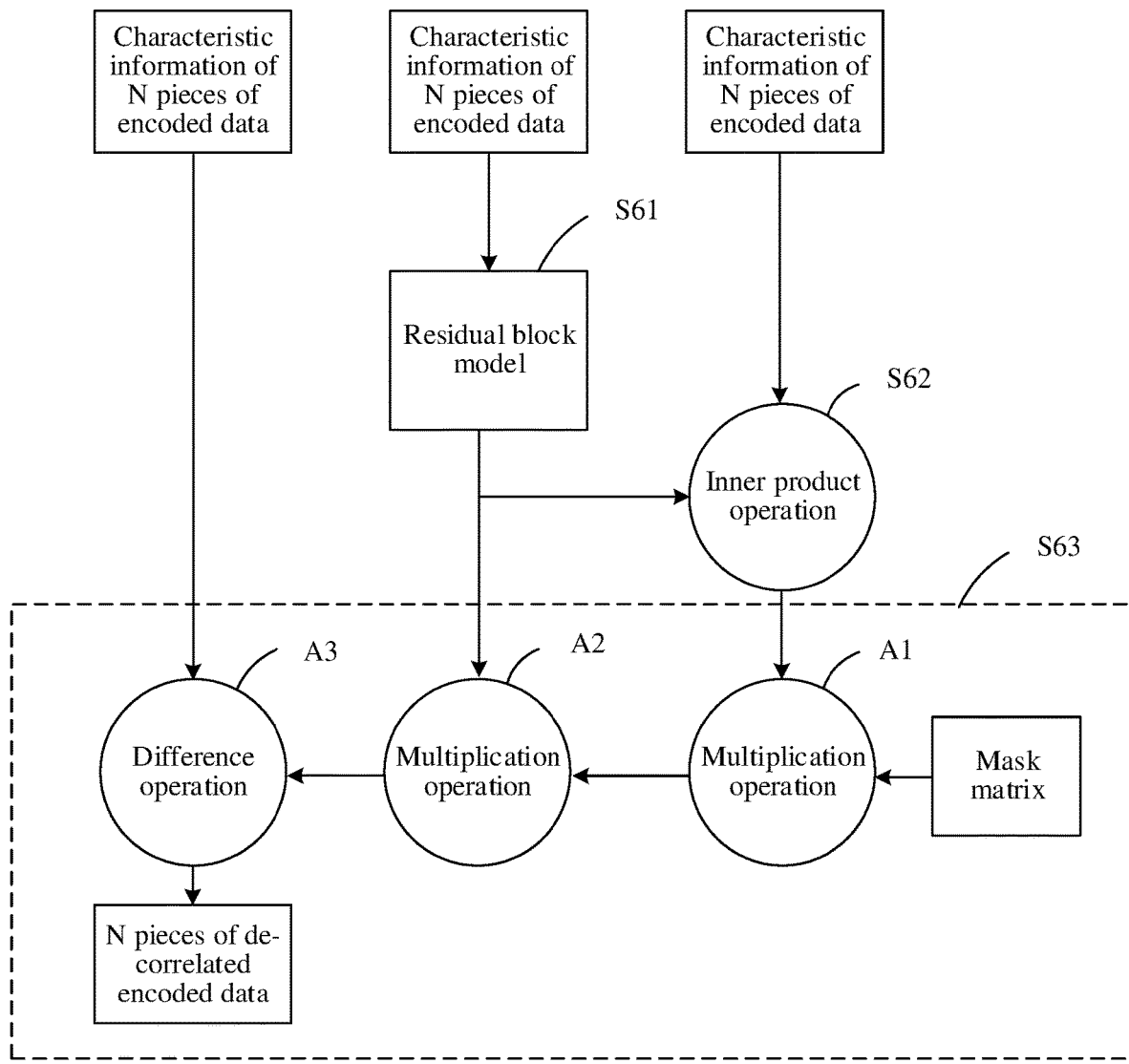
FIG. 7 is another schematic flowchart of a de-correlation method according to an embodiment of this application.

The encoding apparatus may determine the N pieces of de-correlated encoded data based on the N pieces of non-linearly transformed characteristic information, the characteristic information of the N pieces of encoded data, and the correlation coefficient matrix of the N pieces of encoded data. For example, the encoding apparatus may determine the N pieces of de-correlated encoded data based on the following step A1 to step A3. FIG. 7 is another schematic flowchart of the de-correlation method shown in FIG. 6 by using the following step A1 to step A3 as an example.

A1: An encoding apparatus may perform a mask operation on a correlation coefficient matrix of N pieces of encoded data to obtain a masked correlation coefficient matrix. A part of correlation coefficients in the correlation coefficient matrix of the N pieces of encoded data may be retained by using the mask operation. For example, the encoding apparatus may perform a multiplication operation on a mask matrix and the correlation coefficient matrix of the N pieces of encoded data to obtain a masked correlation coefficient matrix. The mask matrix may be an upper-right triangular matrix. In other words, a correlation coefficient of an upper-right triangular region is reserved. Alternatively, the mask matrix may be a lower-left triangular matrix. In other words, a correlation coefficient of a lower-left triangular region is reserved. Alternatively, the mask matrix may be another mask matrix. This is not limited in this embodiment of this application.

For example, the mask matrix is the lower-left triangular matrix. The mask matrix may satisfy the following formula (2), and the masked correlation coefficient matrix may satisfy the following formula (3).

$$\text{mask} = \begin{bmatrix} 0 & 0 & 0 & 0 & 0 & 0 \\ 1 & 0 & 0 & 0 & 0 & 0 \\ 1 & 1 & 0 & 0 & 0 & 0 \\ 1 & 1 & 1 & 0 & 0 & 0 \\ 1 & 1 & 1 & 1 & 0 & 0 \\ 1 & 1 & 1 & 1 & 1 & 0 \end{bmatrix} \quad (2)$$

$$\text{Correlation\_mask} = \begin{bmatrix} 0 & 0 & 0 & 0 & 0 & 0 \\ \rho_{12} & 0 & 0 & 0 & 0 & 0 \\ \rho_{13} & \rho_{23} & 0 & 0 & 0 & 0 \\ \rho_{14} & \rho_{24} & \rho_{34} & 0 & 0 & 0 \\ \rho_{15} & \rho_{25} & \rho_{35} & \rho_{45} & 0 & 0 \\ \rho_{16} & \rho_{26} & \rho_{36} & \rho_{46} & \rho_{56} & 0 \end{bmatrix} \quad (3)$$

mask represents the mask matrix. Correlation_mask represents the masked correlation coefficient matrix.

A2: The encoding apparatus may determine correlated characteristic information of the N pieces of encoded data based on N pieces of characteristic information after non-linear transformation and the masked correlation coefficient matrix.

For example, the encoding apparatus may perform a multiplication operation on the N pieces of non-linearly transformed characteristic information and the masked correlation coefficient matrix, to obtain the correlated characteristic information of the N pieces of encoded data.

A3: The encoding apparatus performs a difference operation on characteristic information of the N pieces of encoded data and the correlated characteristic information of the N pieces of encoded data, to obtain N pieces of de-correlated encoded data.

By performing step A1 to step A3, the encoding apparatus may obtain the N pieces of de-correlated encoded data based on the N pieces of non-linearly transformed characteristic information, the characteristic information of the N pieces of encoded data, and the correlation coefficient matrix of the N pieces of encoded data. It should be understood that the encoding apparatus may further obtain the N pieces of de-correlated encoded data by using another procedure. This embodiment of this application is not limited thereto. For example, the encoding apparatus may record the characteristic information of the N pieces of encoded data as characteristic information 1 to characteristic information N, and sequentially perform a de-correlation operation on (N−1) pieces of encoded data from characteristic information 2 to the characteristic information N. Specifically, for characteristic information K, the encoding apparatus may separately obtain correlation coefficients between the characteristic information 1 and characteristic information (K−1), to obtain (K−1) correlation coefficients, and then perform a difference operation on the characteristic information K and the (K−1) correlation coefficients, to obtain (K−1) pieces of de-correlated encoded data corresponding to the characteristic information 1 to the characteristic information (K−1), where K is an integer greater than 1 and less than or equal to N.

EXAMPLE 2

Figure 8:
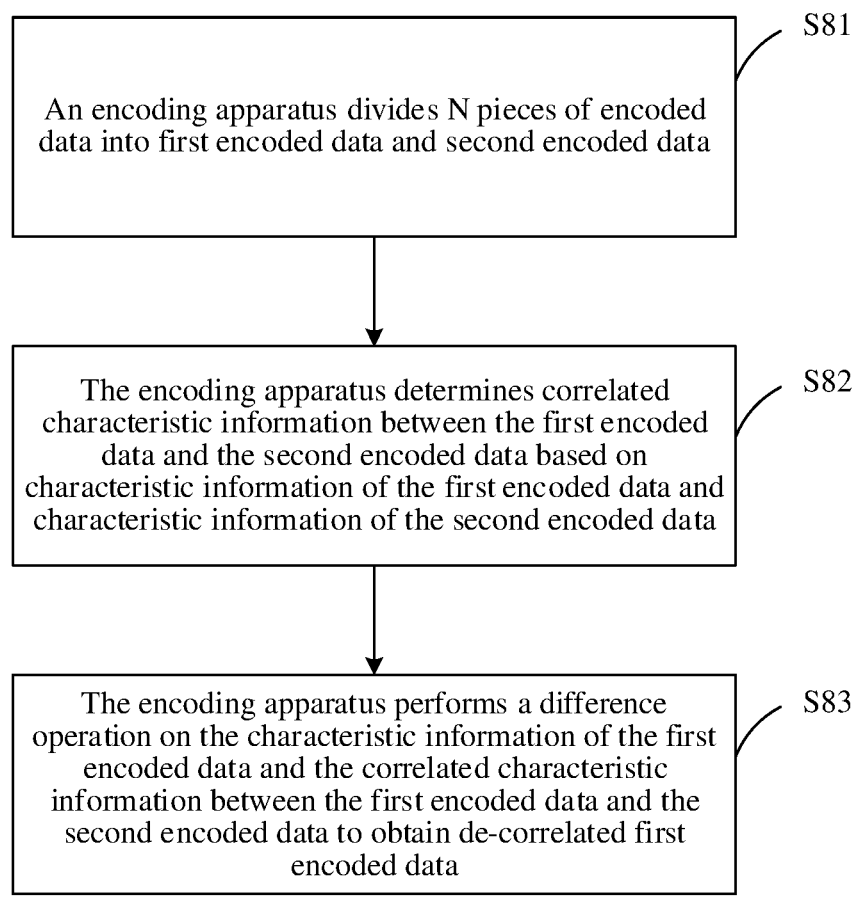
FIG. 8 is still another schematic flowchart of a de-correlation method according to an embodiment of this application.

FIG. 8 is another schematic flowchart of a de-correlation method according to an embodiment of this application.

S81: An encoding apparatus divides N pieces of encoded data into first encoded data and second encoded data.

The encoding apparatus may evenly divide the N pieces of encoded data into two parts, which are respectively denoted as the first encoded data and the second encoded data. Correspondingly, the N pieces of encoded data consist of the first encoded data and the second encoded data. For example, N is 8, the first encoded data includes four pieces of encoded data in eight pieces of encoded data, and the second encoded data includes four remaining pieces of encoded data except the first encoded data in the eight pieces of encoded data. For example, characteristic information of the N pieces of encoded data may be represented as H×W×2C in a three-dimensional manner, H represents a characteristic of a first dimension, for example, a height of a three-dimensional characteristic information matrix of the encoded data; W represents a characteristic of a second dimension, for example, a width of a three-dimensional characteristic information matrix of the encoded data; and 2C represents a characteristic of a third dimension, for example, a depth of a three-dimensional characteristic information matrix of the encoded data. That the encoding apparatus evenly divides the N pieces of encoded data into two parts may mean that the characteristic information of the N pieces of encoded data is evenly divided into two parts in the third dimension. In other words, characteristic information of the first encoded data may be represented as H×W×C, and characteristic information of the second encoded data may be represented as H×W×C.

S82: The encoding apparatus determines correlated characteristic information between the first encoded data and the second encoded data based on characteristic information of the first encoded data and characteristic information of the second encoded data.

Figure 9:
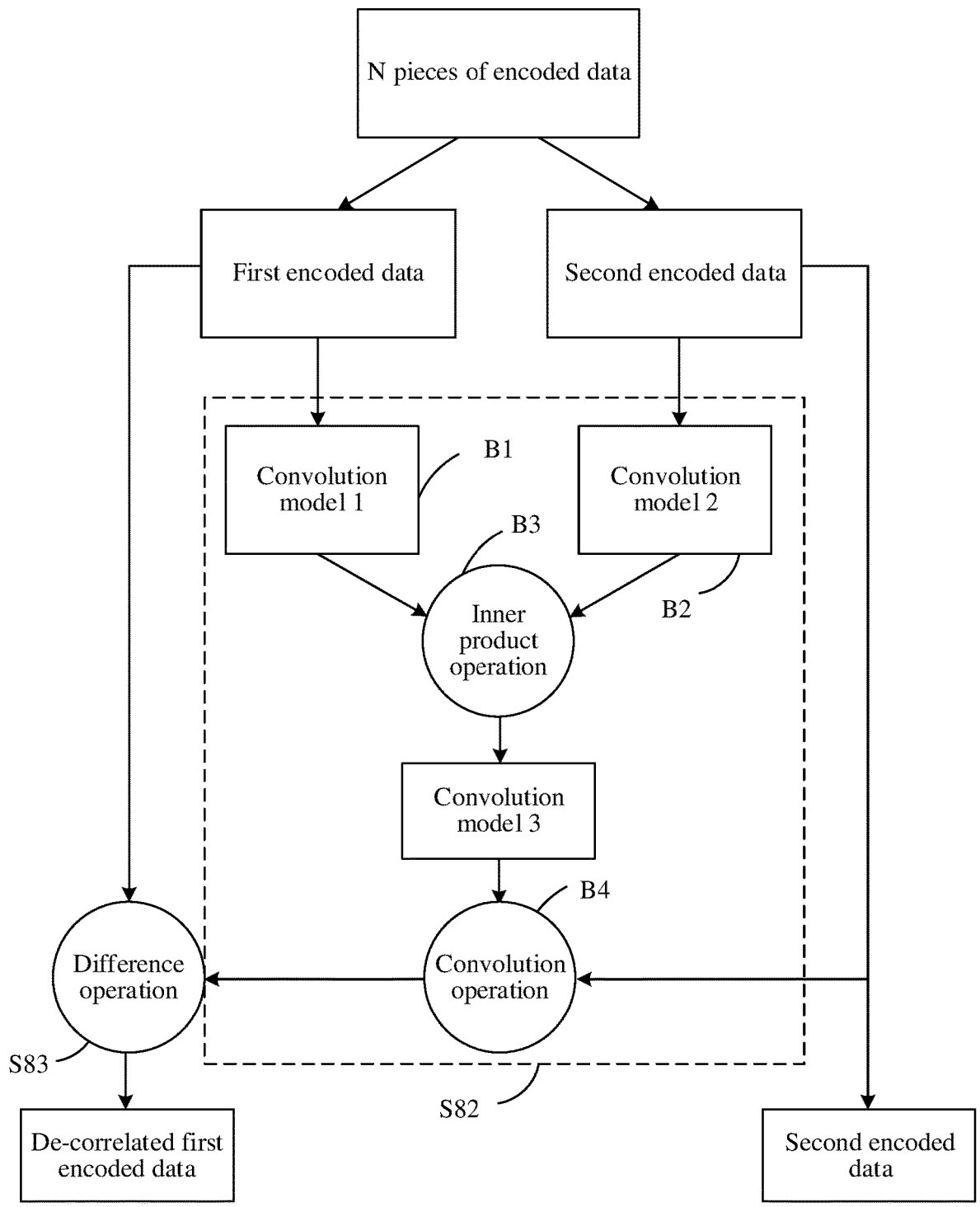
FIG. 9 is yet another schematic flowchart of a de-correlation method according to an embodiment of this application.

For example, the encoding apparatus may determine, by using a convolution model, correlated characteristic information between the first encoded data and the second encoded data based on the characteristic information of the first encoded data and the feature information of the second encoded data. There may be one or more convolution models. For example, the encoding apparatus may determine correlated characteristic information between the first encoded data and the second encoded data based on the following step B1 to step B4. It should be understood that this embodiment of this application is not limited thereto. For example, the encoding apparatus may further perform non-linear transformation on the first encoded data by using a residual block model, and then perform an inner product operation on first encoded data after the non-linear transformation and the second encoded data to obtain the correlated characteristic information between the first encoded data and the second encoded data. FIG. 9 is another schematic flowchart of the de-correlation method shown in FIG. 8 by using the following step B1 to step B4 as an example.

B1: An encoding apparatus may perform a convolution operation on characteristic information of a first encoded data to obtain characteristic information of the first encoded data after the convolution operation.

For example, the encoding apparatus may determine, by using a convolution model 1, the characteristic information of the first encoded data after the convolution operation. The convolution model 1 may be constructed by using a convolutional neural network, and the convolution model 1 may perform an inter-channel convolution operation on the characteristic information of the first encoded data. For example, a convolution kernel dimension of the convolution model 1 is 1×1×C, which means that the convolution operation is performed on the characteristic information of the first encoded data only in a third dimension. Correspondingly, the characteristic information of the first encoded data after the convolution operation may be represented as H×W×1.

B2: The encoding apparatus may perform a convolution operation on characteristic information of a second encoded data to obtain characteristic information of the second encoded data after the convolution operation.

For example, the encoding apparatus may determine, by using a convolution model 2, the characteristic information of the second encoded data after the convolution operation. The convolution model 2 may be constructed by using a convolutional neural network, and the convolution model 2 may perform an inter-channel convolution operation on the characteristic information of the second encoded data. For example, a convolution kernel dimension of the convolution model 2 is 1×1×C, which means that the convolution operation is performed on the characteristic information of the second encoded data only in a third dimension. Correspondingly, the characteristic information of the second encoded data after the convolution operation may be represented as H×W×1.

B3: The encoding apparatus performs an inner product operation on the characteristic information of the first encoded data after the convolution operation and the characteristic information of the second encoded data after the convolution operation, to obtain a correlation coefficient matrix between the first encoded data and the second encoded data.

That the encoding apparatus performs an inner product operation on the characteristic information of the first encoded data after the convolution operation and the characteristic information of the second encoded data after the convolution operation may be understood as extracting an $i^{th}$ H×W matrix of the characteristic information of the first encoded data after the convolution operation to obtain a column vector, where i is an integer greater than or equal to 1 and less than or equal to C; extracting a $j^{th}$ H×W matrix of the characteristic information of the second encoded data after the convolution operation to obtain a column vector, where j is an integer greater than or equal to 1 and less than or equal to C; and performing an inner product operation on the two column vectors to obtain a correlation coefficient matrix between the first encoded data and the second encoded data, where the correlation coefficient matrix between the first encoded data and the second encoded data may be represented as C×C.

B4: The encoding apparatus performs a convolution operation on the correlation coefficient matrix between the first encoded data and the second encoded data and the characteristic information of the second encoded data to obtain correlated characteristic information between the first encoded data and the second encoded data.

The encoding apparatus may perform a convolution operation on the correlation coefficient matrix obtained in step B3 and the characteristic information of the second encoded data. For example, multiplication is performed in a third dimension to obtain the correlated characteristic information between the first encoded data and the second encoded data.

Alternatively, the encoding apparatus may perform a convolution operation on the correlation coefficient matrix obtained in step B3 by using the convolution model 3, and then perform a difference operation on correlation coefficient matrix after the convolution and the characteristic information of the second encoded data, to obtain the correlated characteristic information between the first encoded data and the second encoded data. A convolution kernel dimension of the convolution model 3 may be 1×1×1, which is equivalent to multiplying the correlation coefficient matrix obtained in step B3 by a constant. A value of the constant may be obtained through optimization by using a gradient descent method.

Then, the encoding apparatus determines the correlated characteristic information between the first encoded data and the second encoded data.

S83: The encoding apparatus performs a difference operation on the characteristic information of the first encoded data and the correlated characteristic information between the first encoded data and the second encoded data to obtain de-correlated first encoded data.

The encoding apparatus may perform the difference operation on the characteristic information of the first encoded data and the correlated characteristic information between the first encoded data and the second encoded data to obtain de-correlated first encoded data.

Further, the encoding apparatus may perform the steps shown in FIG. 8 and FIG. 9 on the de-correlated first encoded data; or the encoding apparatus may perform the steps shown in FIG. 8 and FIG. 9 on the second encoded data; or the encoding apparatus may separately perform the steps shown in FIG. 8 and FIG. 9 on the de-correlated first encoded data and the second encoded data until N pieces of de-correlated encoded data are obtained.

A bandwidth resource is needed for transmitting each piece of encoded data. Usually, more pieces of the transmitted encoded data or a larger amount of the transmitted encoded data indicates that more bandwidth resources available for the decoding apparatus are needed. However, when a bandwidth resource of the decoding apparatus is pre-configured (for example, pre-configured by an operator) or a currently idle bandwidth resource is insufficient, the decoding apparatus cannot receive all the encoded data. Consequently, the decoding apparatus fails to receive data. According to the method in Example 1 or Example 2 of this application, the encoding apparatus de-correlates the N pieces of encoded data to obtain the N pieces of de-correlated encoded data, and a part of the N pieces of de-correlated encoded data may be used for obtaining third data whose approximation degree to first data is greater than or equal to a specified threshold. In other words, by using the method described in this application, the decoding apparatus may receive encoded data based on a data receiving capability of the decoding apparatus, to improve a bandwidth adaptation capability of the encoded data.

The encoding apparatus de-correlates the N pieces of encoded data to obtain the N pieces of de-correlated encoded data. Then, the encoding apparatus may perform content of step S53.

S53: The encoding apparatus sends the N pieces of de-correlated encoded data. Correspondingly, the decoding apparatus receives M pieces of the N pieces of de-correlated encoded data based on the data receiving capability.

The encoding apparatus sends the N pieces of de-correlated encoded data. For the decoding apparatus, the decoding apparatus may receive, based on the data receiving capability of the decoding apparatus, a part or all of the N pieces of de-correlated encoded data, which are denoted as the M pieces, where M is a positive integer greater than 0 and less than or equal to N. The data receiving capability may include the bandwidth resource that can be used by the decoding apparatus, or include a hardware resource of the decoding apparatus, or include the bandwidth resource that can be used by the decoding apparatus and a hardware resource of the decoding apparatus. The bandwidth resource that can be used by the decoding apparatus may be a bandwidth resource configured by the decoding apparatus, for example, configured by a network device or configured by an operator. The hardware resource may be a quantity of receive antennas, a radio frequency link, or the like configured for the decoding apparatus. For example, N is 6. If a bandwidth resource needed by each piece of de-correlated encoded data is 2 megahertz (MHz), a bandwidth resource of 12 MHz is needed to receive six pieces of de-correlated encoded data. It is assumed that a bandwidth resource that can be used by the decoding apparatus is 6 MHz. Although the encoding apparatus sends six pieces of de-correlated encoded data, the decoding apparatus may receive three or less than three pieces of the six pieces of de-correlated encoded data based on the bandwidth resource of the decoding apparatus.

Because the third data whose approximation degree to the first data is greater than the specified threshold can be restored from a part of the N pieces of de-correlated encoded data, when the data receiving capability of the decoding apparatus does not support receiving of all the N pieces of de-correlated encoded data, the decoding apparatus may receive a part of the N pieces of de-correlated encoded data, and can also obtain complete information of the first data by using the part of the encoded data, to implement bandwidth adaptation of the encoded data.

S54: The decoding apparatus obtains reconstructed N pieces of to-be-decoded data based on the M pieces of de-correlated to-be-decoded data.

For example, the decoding apparatus may reconstruct the M pieces of de-correlated to-be-decoded data, to obtain the reconstructed N pieces of to-be-decoded data. The following describes step S54 with reference to FIG. 10.

Figure 10:
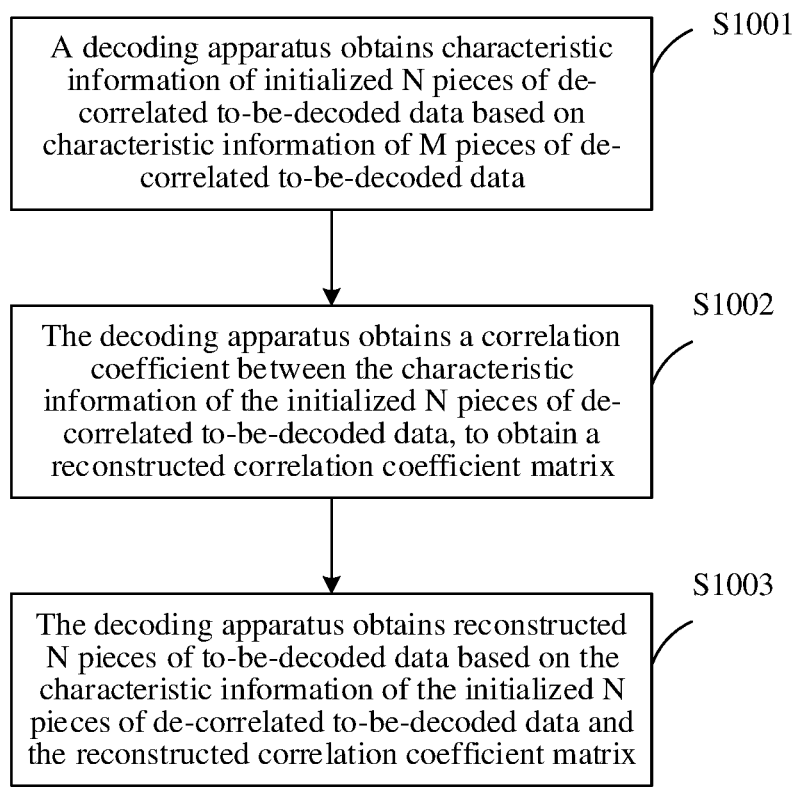
FIG. 10 is a schematic flowchart of obtaining reconstructed N pieces of to-be-decoded data according to an embodiment of this application.

FIG. 10 is a schematic flowchart of obtaining reconstructed N pieces of to-be-decoded data according to an embodiment of this application.

S1001: A decoding apparatus obtains characteristic information of initialized N pieces of de-correlated to-be-decoded data based on characteristic information of M pieces of de-correlated to-be-decoded data.

For example, the decoding apparatus may perform a supplement operation on the characteristic information of the M pieces of de-correlated to-be-decoded data, to obtain the characteristic information of the initialized N pieces of de-correlated to-be-decoded data. For example, the decoding apparatus may perform the supplement operation on the characteristic information of the M pieces of de-correlated to-be-decoded data by using a residual block algorithm. The residual block algorithm may also be referred to as a residual block model, and the residual block algorithm may be for obtaining characteristic information of initialized (N−M) pieces of de-correlated to-be-decoded data. Specifically, the decoding apparatus may use the characteristic information of the M pieces of de-correlated to-be-decoded data as an input of the residual block model, to obtain the characteristic information of the initialized (N−M) pieces of de-correlated to-be-decoded data related to the M pieces of de-correlated to-be-decoded data. Further, the decoding apparatus may concatenate the characteristic information of the initialized (N−M) pieces of de-correlated to-be-decoded data with the M pieces of de-correlated to-be-decoded data, to obtain characteristic information of initialized N pieces of de-correlated to-be-decoded data.

For example, N is 6, and M is 2. The decoding apparatus inputs characteristic information of two pieces of de-correlated to-be-decoded data into the residual block model, to obtain characteristic information of four initialized pieces of de-correlated to-be-decoded data, and then concatenates the characteristic information of the four initialized pieces of de-correlated to-be-decoded data with the characteristic information of the two pieces of de-correlated to-be-decoded data, to obtain characteristic information of six initialized pieces of de-correlated to-be-decoded data.

S1002: The decoding apparatus obtains a correlation coefficient between the characteristic information of the initialized N pieces of de-correlated to-be-decoded data, to obtain a reconstructed correlation coefficient matrix.

For example, the decoding apparatus may obtain the correlation coefficient between the characteristic information of the initialized N pieces of de-correlated to-be-decoded data, for example, obtain the correlation coefficient between the characteristic information of the initialized N pieces of de-correlated to-be-decoded data by using a channel attention algorithm. The channel attention algorithm may also be referred to as a channel attention model, and the channel attention model may be for obtaining a reconstructed correlation coefficient matrix. The channel attention model may include a global average and two fully connected layers, and may be for obtaining a correlation coefficient (also referred to as a channel attention coefficient) between different characteristic information. An input of the channel attention model may be the characteristic information of the initialized N pieces of de-correlated to-be-decoded data, and an output may be the reconstructed correlation coefficient matrix.

S1003: The decoding apparatus obtains reconstructed N pieces of to-be-decoded data based on the characteristic information of the initialized N pieces of de-correlated to-be-decoded data and the reconstructed correlation coefficient matrix.

Figure 11:
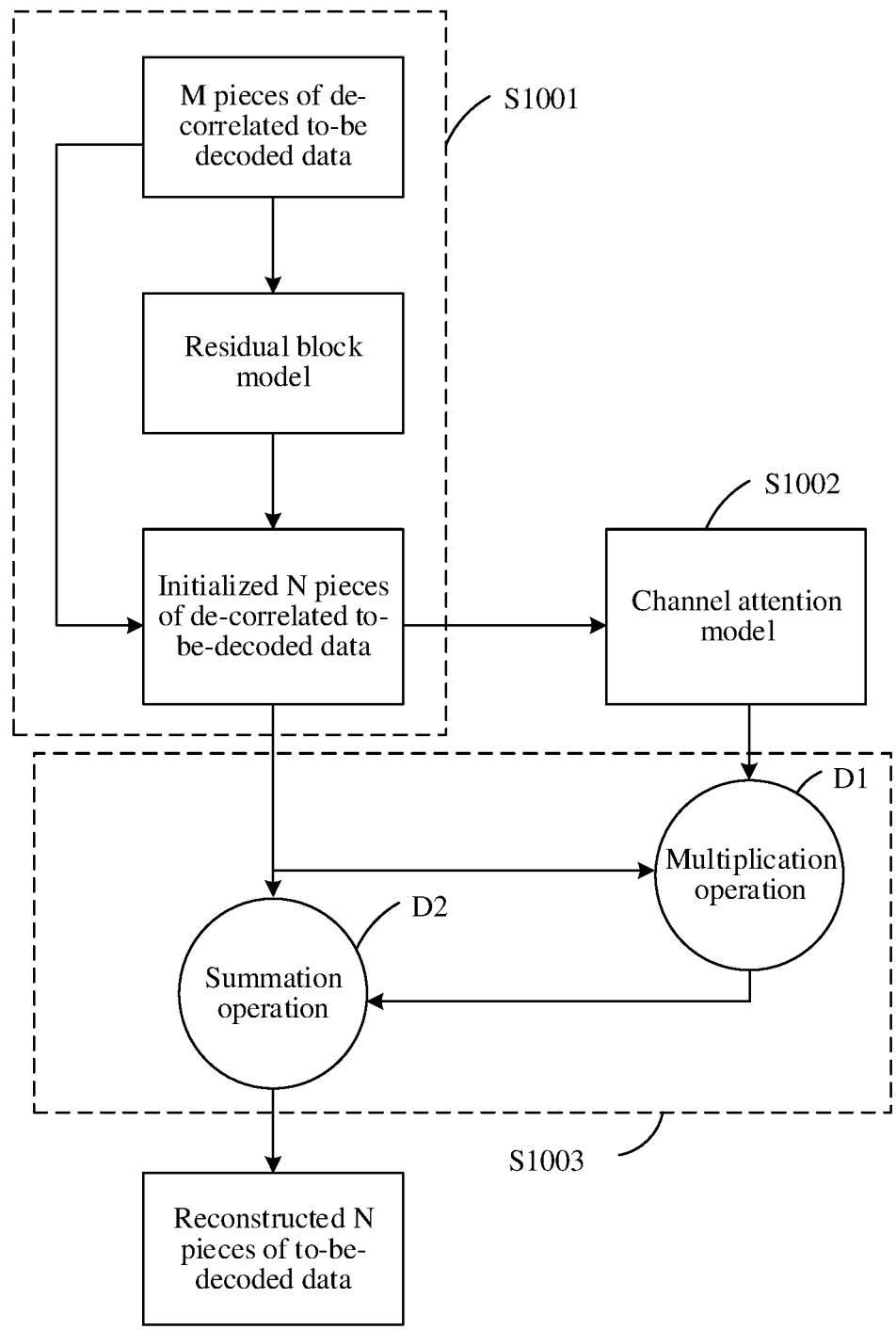
FIG. 11 is another schematic flowchart of obtaining reconstructed N pieces of to-be-decoded data according to an embodiment of this application.

For example, the decoding apparatus may obtain the reconstructed N pieces of to-be-decoded data based on the following steps: D1: The decoding apparatus may perform a multiplication operation on the characteristic information of the initialized N pieces of de-correlated to-be-decoded data and the reconstructed correlation coefficient matrix, to obtain correlated characteristic information of the reconstructed N pieces of to-be-decoded data. D2: The decoding apparatus may perform a summation operation on the characteristic information of the initialized N pieces of de-correlated to-be-decoded data and the correlated characteristic information of the reconstructed N pieces of to-be-decoded data, to obtain the reconstructed N pieces of to-be-decoded data, as shown in FIG. 11.

In this case, the decoding apparatus obtains the reconstructed N pieces of to-be-decoded data. Next, the decoding apparatus performs content of step S55.

S55: The decoding apparatus decodes the reconstructed N pieces of to-be-decoded data by using a decoding model, to obtain second data.

There may be one or more decoding models, for example, one or more models constructed based on a deconvolutional neural network. For example, an input of the decoding model is the reconstructed N pieces of to-be-decoded data, and an output is the second data. For example, each piece of reconstructed to-be-decoded data corresponds to 1/N input of the deconvolutional neural network. In other words, an input layer of the decoding model includes N nodes, and one piece of reconstructed to-be-decoded data is input into each node. The second data may be for restoring third data, and the third data is the same as the first data, or an approximation degree between the third data and the first data is greater than or equal to a specified threshold.

In the technical solution shown in FIG. 5, the encoding apparatus de-correlates the N pieces of encoded data, to obtain independent and uncorrelated N pieces of de-correlated encoded data. A part of the N pieces of de-correlated encoded data may be for restoring the first data or the third data whose approximation degree to the first data is greater than or equal to the specified threshold. In this way, even if the decoding apparatus receives a part of the N pieces of de-correlated to-be-decoded data because the bandwidth resource of the decoding apparatus does not support receiving of all the N pieces of de-correlated to-be-decoded data, the third data whose approximation degree to the first data is greater than the specified threshold can be obtained, to implement successful data receiving and improve a bandwidth adaptation capability of the encoded data.

Figure 12:
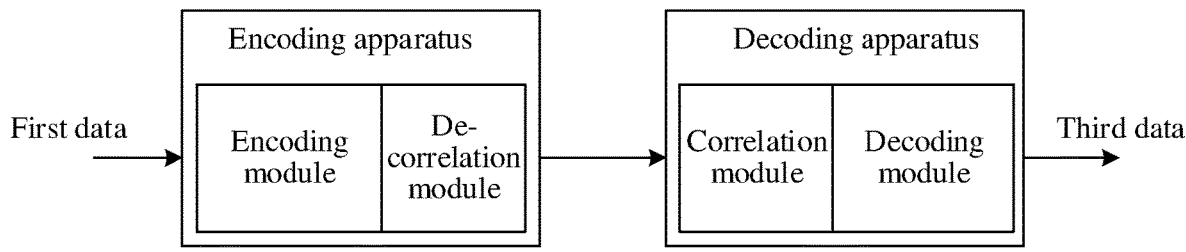
FIG. 12 is a schematic diagram of a structure of a communication system according to an embodiment of this application.

For example, FIG. 12 is a schematic diagram of a structure of a communication system. As shown in FIG. 12, the communication system includes an encoding apparatus and a decoding apparatus. The encoding apparatus includes an encoding module and a de-correlation module, and the decoding apparatus includes a correlation module and a decoding module. The encoding module may encode first data by using the encoding model to obtain N pieces of encoded data, that is, perform step S51 in the embodiment shown in FIG. 5. The de-correlation module may de-correlate the N pieces of encoded data, to obtain N pieces of de-correlated encoded data, that is, perform step S52 and the like in the embodiment shown in FIG. 5. The correlation module may obtain the reconstructed N pieces of to-be-decoded data based on the M pieces of de-correlated to-be-decoded data, that is, perform step S54 and the like in the embodiment shown in FIG. 5. The decoding module may decode the reconstructed N pieces of to-be-decoded data by using the decoding model, that is, obtain second data, to perform step S55 in the embodiment shown in FIG. 5.

In a possible implementation, the decoding apparatus may restore the third data by using the second data, and determine a first parameter based on the first data and the third data. The first parameter may be for determining a loss function. For example, the first parameter is for determining an optimal parameter set for constructing the loss function. The loss function may be for updating one or more of a plurality of models in the foregoing embodiments of this application, and/or a parameter that is used in each method. The first parameter may be determined based on a peak signal-to-noise ratio between the first data and the third data, or may be determined based on a mean square error between the first data and the third data.

It should be noted that, that the decoding apparatus determines the first parameter based on the first data and the third data may be understood as that the decoding apparatus determines the first parameter based on one or more groups of first data and third data. For example, the decoding apparatus may periodically (for example, every month or every week) determine the first parameter. Specifically, the decoding apparatus may determine the first parameter based on one or more groups of first data and third data in a periodicity. For another example, the decoding apparatus may alternatively determine the first parameter aperiodically. For example, when a quantity of times of receiving by the decoding apparatus reaches a specified threshold, the decoding apparatus determines the first parameter based on a plurality of groups of first data and third data.

The following describes the first parameter.

(1) The first parameter may be determined based on the peak signal-to-noise ratio between the first data and the third data. In other words, the decoding apparatus may determine the first parameter based on the peak signal-to-noise ratio between the first data and the third data. For example, the decoding apparatus may determine the peak signal-to-noise ratio between the first data and the third data. Further, the decoding apparatus may perform an expected value operation on the peak signal-to-noise ratio between the first data and the third data, to obtain the first parameter.

For example, the peak signal-to-noise ratio between the first data and the third data may satisfy the following formula (4). The first parameter may satisfy the following formula (5).

$$P_M = \log_{10} \frac{MAX^2}{MSE} \quad (4)$$

$$L_M = E[w_M * P_M] \quad (5)$$

$P_M$ is the peak signal-to-noise ratio between the first data and the third data, $L_M$ is the first parameter, and $E[\cdot]$ is the expected value operation. M is a quantity of pieces of de-correlated encoded data used to determine the second data, and M is an integer greater than 0 and less than or equal to N. $w_M$ represents weights corresponding to different bandwidth resources, namely, weights corresponding to different values of M, and may be understood as constants. MSE is a mean square error between the first data and the third data. If the first data is image data (or video data), MAX is a maximum value of an image pixel (or a pixel of each frame of image); or if the first data is audio data or other information, a value of MAX is 1. For example, the first data is a 24-bit depth RGB image, each color pixel includes 8 bits, and in this case, $MAX=2^8-1=255$.

For example, the optimal parameter set for constructing the loss function that is determined by the first parameter may satisfy the following formula (6).

$$\theta^* = \operatorname{argmax} \sum_{M=1}^{N} L_M \quad (6)$$

$\theta^*$ represents the optimal parameter set for constructing the loss function, arg max represents an operation of obtaining a parameter used for taking a maximum value, and $$\sum_{M=1}^{N} L_M$$

represents performing a summation operation on first parameters corresponding to N different bandwidth resources (or a quantity of pieces of different de-correlated encoded data).

(2) The first parameter may be determined based on the mean square error between the first data and the third data. For example, the first parameter $L_M$ and the optimal parameter set for constructing the loss function may respectively satisfy the following formula (7) and formula (8).

$$L_M = E[w_M * MSE] \quad (7)$$

$$\theta^* = \operatorname{argmin} \sum_{M=1}^{N} L_M \quad (8)$$

M is a quantity of pieces of de-correlated encoded data used to determine the second data, and M is an integer greater than 0 and less than or equal to N. $w_M$ represents weights corresponding to different bandwidth resources, namely, weights corresponding to different values of M, and may be understood as constants. MSE represents the mean square error between the first data and the third data, $\theta^*$ represents the optimal parameter set for constructing the loss function, $E[\cdot]$ is the expected value operation, and arg min represents an operation of obtaining a parameter used for taking a minimum value.

In an example, the decoding apparatus may update the decoding model based on second information; or update, based on the second information, a parameter that is used in processing of obtaining reconstructed N pieces of to-be-decoded data, for example, update one or more parameters (a parameter related to a deep neural network such as a weight coefficient) of the residual model used in step S1001, or update one or more parameters of the channel attention model used in step S1002; or update, based on the second information, the decoding model and a parameter that is used in processing of obtaining reconstructed N pieces of to-be-decoded data. The second information may include the first parameter, include a specified signal-to-noise ratio, or include the first parameter and a specified signal-to-noise ratio. For example, the specified signal-to-noise ratio may be a plurality of common signal-to-noise ratios, such as an SNR 0, an SNR 1, an SNR 2, and an SNR 3, or a common signal-to-noise ratio range, such as [SNR 0, SNR 1]. This is not limited in this embodiment of this application. The specified signal-to-noise ratio may be predefined by a system, or may be pre-agreed on by the encoding apparatus and the decoding apparatus, or the like. This is not limited in this embodiment of this application.

For example, the decoding apparatus may use the specified signal-to-noise ratio, the third data, and the pilot signal as inputs, determine, based on the first parameter, an optimal parameter set for constructing the loss function, for example, the optimal parameter set shown in the formula (6) or the optimal parameter set shown in the formula (8), and train the decoding model until convergence, to obtain an updated decoding model.

Figure 13:
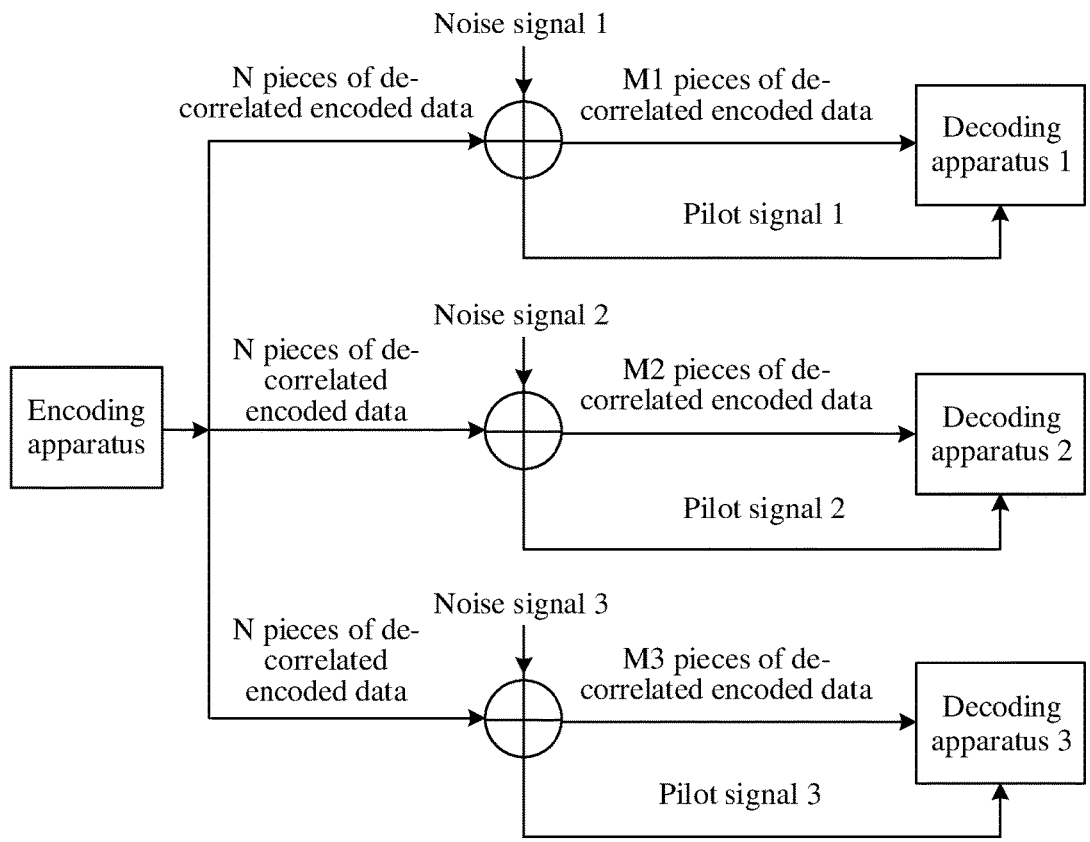
FIG. 13 is another schematic diagram of a structure of a communication system according to an embodiment of this application.

In a possible implementation, the encoding apparatus may send a pilot signal of the N pieces of the de-correlated encoded data to the decoding apparatus. Correspondingly, the decoding apparatus receives the pilot signal of the N pieces of de-correlated encoded data. The pilot information is for determining channel state information, such as a signal-to-noise ratio, a noise power, a channel response, or a channel coefficient. The pilot signal may be, for example, a sounding reference signal or a demodulation reference signal. A specific form of the pilot signal is not limited in this embodiment of this application. FIG. 13 is an example of another schematic diagram of a structure of a communication system. As shown in FIG. 13, a decoding apparatus 1, a decoding apparatus 2, and a decoding apparatus 3 receive first data from an encoding apparatus. The decoding apparatus 1 receives M1 pieces of de-correlated encoded data of N pieces of de-correlated encoded data and a pilot signal 1 from the encoding apparatus based on a data receiving capability of the decoding apparatus 1. The decoding apparatus 2 receives M2 pieces of de-correlated encoded data of the N pieces of de-correlated encoded data and a pilot signal 2 from the encoding apparatus based on a data receiving capability of the decoding apparatus 2. The decoding apparatus 3 receives M3 pieces of de-correlated encoded data of the N pieces of de-correlated encoded data and a pilot signal 3 from the encoding apparatus based on a data receiving capability of the decoding apparatus 3. M1, M2, and M3 each are an integer greater han 0 and less than or equal to N.

In another possible implementation, the decoding apparatus may determine channel state information based on a pilot signal of the N pieces of de-correlated encoded data, and may obtain M pieces of de-noising and de-correlated to-be-decoded data by using a deconvolutional neural network model and the channel state information. The channel state information may include but is not limited to a signal-to-noise ratio or a noise power.

Figure 14:
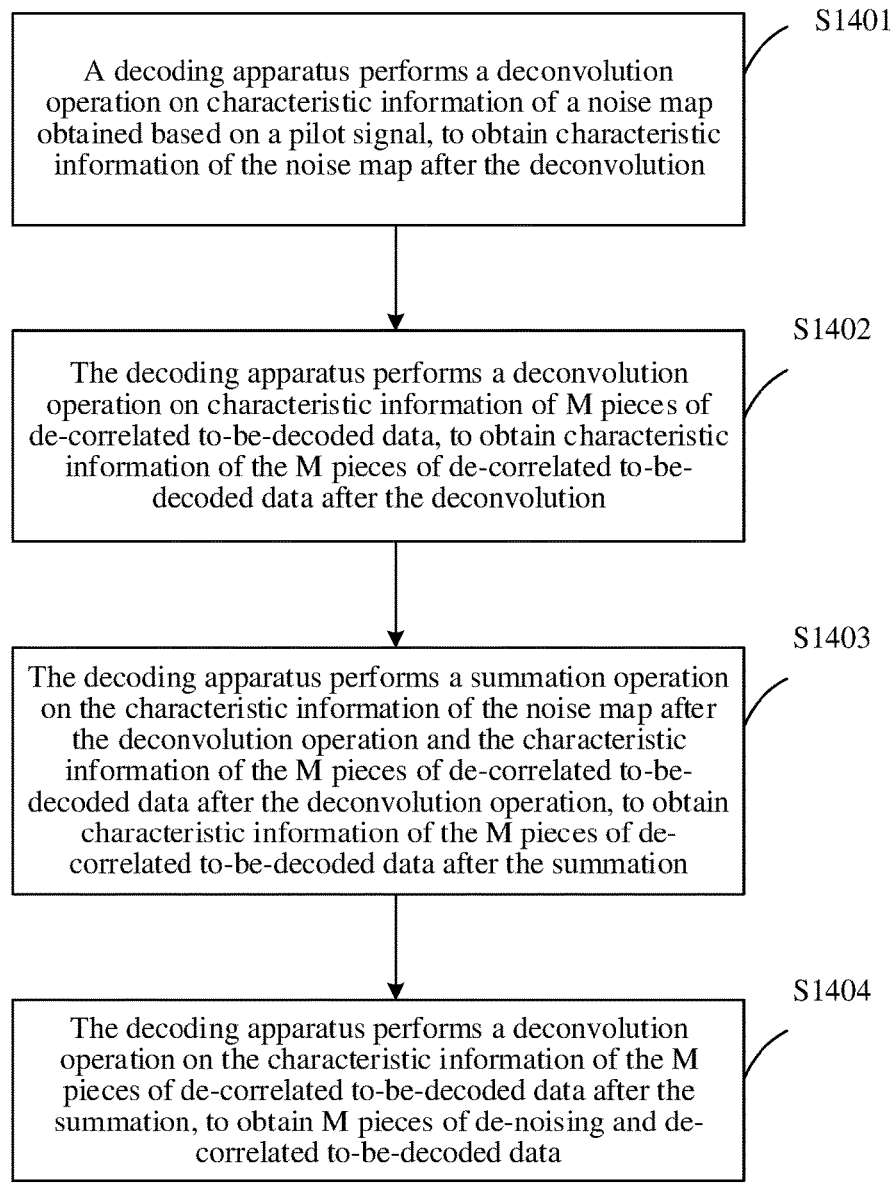
FIG. 14 is a schematic flowchart of a de-noising method according to an embodiment of this application.

FIG. 14 is a schematic flowchart of a de-noising method according to an embodiment of this application. As shown in FIG. 14, the method includes the following steps.

S1401: The decoding apparatus performs a deconvolution operation on characteristic information of a noise map obtained based on a pilot signal, to obtain characteristic information of the noise map after the deconvolution.

For example, the decoding apparatus may determine a signal-to-noise ratio or a noise power by using a pilot signal, extend the signal-to-noise ratio or the noise power to a noise map (noise map) that has a same dimension as the M pieces of de-correlated to-be-decoded data, and then input characteristic information of the noise map into a deconvolutional neural network model 1, to perform a deconvolution operation on the characteristic information of the noise map, to obtain characteristic information of the noise map after the deconvolution operation.

S1402: The decoding apparatus performs a deconvolution operation on the characteristic information of the M pieces of de-correlated to-be-decoded data, to obtain characteristic information of the M pieces of de-correlated to-be-decoded data after the deconvolution.

For example, the decoding apparatus may input the characteristic information of the M pieces of de-correlated to-be-decoded data into a deconvolutional neural network model 2, to perform the deconvolution operation on the characteristic information of the M pieces of de-correlated to-be-decoded data, to obtain the characteristic information of the M pieces of de-correlated to-be-decoded data after the deconvolution operation.

An execution sequence of step S1401 and step S1402 is merely an example. This is not limited in this embodiment of this application. For example, the decoding apparatus may first perform step S1401 and then perform step S1402, or may first perform step S1402 and then perform step S1401, or may simultaneously perform step S1401 and step S1402.

S1403: The decoding apparatus performs a summation operation on the characteristic information of the noise map after the deconvolution operation and the characteristic information of the M pieces of de-correlated to-be-decoded data after the deconvolution operation, to obtain characteristic information of the M pieces of de-correlated to-be-decoded data after the summation.

S1404: The decoding apparatus performs a deconvolution operation on the characteristic information of the M pieces of de-correlated to-be-decoded data after the summation, to obtain M pieces of de-noising and de-correlated to-be-decoded data.

For example, the decoding apparatus may input the characteristic information of the M pieces of de-correlated to-be-decoded data after the summation into the deconvolutional neural network model 3, to perform the deconvolution operation on the characteristic information of the M pieces of de-correlated to-be-decoded data after the summation, to obtain the M pieces of de-noising and de-correlated to-be-decoded data.

It should be noted that the deconvolutional neural network model 1, the deconvolutional neural network model 2, and the deconvolutional neural network model 3 may be the same, or may be different. This is not limited in this embodiment of this application. Further, the decoding apparatus may update at least one of the deconvolutional neural network model 1, the deconvolutional neural network model 2, or the deconvolutional neural network model 3 based on second information.

According to the foregoing embodiment, the decoding apparatus may obtain, based on the pilot signal, channel state information in a process of transmitting de-correlated encoded data, and perform de-noising processing based on the channel state information and received de-correlated encoded data, to improve a channel adaptation capability of encoded data.

Figure 15:
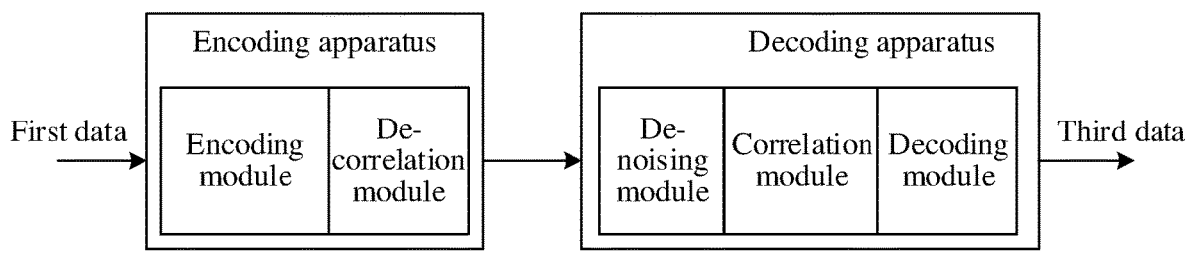
FIG. 15 is still another schematic diagram of a structure of a communication system according to an embodiment of this application.

FIG. 15 is an example of still another schematic diagram of a structure of a communication apparatus. As shown in FIG. 15, a de-noising module may perform de-noising processing on M pieces of de-correlated encoded data based on a pilot signal of N pieces of de-correlated encoded data, to obtain M pieces of de-noising and de-correlated to-be-decoded data, that is, perform the steps in the embodiment shown in FIG. 14. Further, the correlation module may reconstruct N pieces of to-be-decoded data based on characteristic information of the M pieces of de-noising and de-correlated to-be-decoded data, that is, perform step S54 in the embodiment shown in FIG. 5, and the steps in the embodiments shown in FIG. 10 and FIG. 11. It should be understood that functions of other modules in FIG. 15 are the same as functions of corresponding modules in FIG. 12, and details are not described herein again.

Figure 16:
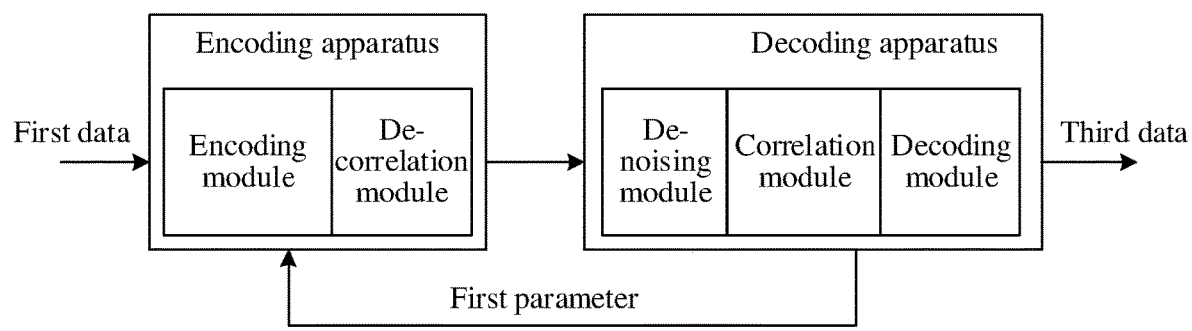
FIG. 16 is yet another schematic diagram of a structure of a communication system according to an embodiment of this application.

In another possible implementation, the decoding apparatus may send a first parameter to the encoding apparatus, and correspondingly, the encoding apparatus may receive the first parameter. For example, the decoding apparatus may send the first parameter to the encoding apparatus periodically (for example, every month or every week), or the decoding apparatus may send the first parameter to the encoding apparatus aperiodically. For example, the decoding apparatus aperiodically determines the first parameter, and sends the first parameter to the encoding apparatus after determining the first parameter. FIG. 16 is an example of yet another schematic diagram of a structure of a communication apparatus. As shown in FIG. 16, a decoding apparatus may send a first parameter to an encoding apparatus aperiodically or periodically.

In an example, the encoding apparatus may update an encoding model based on first information; or update, based on first information, a parameter that is used in processing of de-correlation, for example, update one or more parameters in the residual block model used in step S61, or update one or more parameters in the convolution model (such as the convolution model 1 and the convolution model 2) used in step S82; or update, based on first information, an encoding model and a parameter that is used in processing of de-correlation. The first information may include the first parameter, include a specified bandwidth resource, or include the first parameter and a specified bandwidth resource. There may be a plurality of specified bandwidth resources. For example, the encoding apparatus may use different bandwidth resources and first data as inputs, determine, based on the first parameter, an optimal parameter set for constructing the loss function, for example, the optimal parameter set shown in the formula (6) or the optimal parameter set shown in the formula (8), and train the encoding model until convergence, to obtain an updated encoding model.

To implement functions in the method provided in embodiments of this application, the encoding apparatus and the decoding apparatus may include a hardware structure and/or a software module, and implement the foregoing functions in a form of the hardware structure, the software module, or a combination of the hardware structure and the software module. Whether a function in the foregoing functions is performed by the hardware structure, the software module, or the combination of the hardware structure and the software module depends on particular applications and design constraints of the technical solutions. For example, all related content of the steps in the foregoing method embodiments may be cited in function descriptions of corresponding functional modules in FIG. 12, FIG. 15, and FIG. 16, and details are not described herein again.

In embodiments of this application, division into modules is an example, and is merely logical function division. During actual implementation, there may be another division manner. In addition, in embodiments of this application, functional modules may be integrated into one processor, or each of the modules may exist alone physically, or two or more modules may be integrated into one module. The integrated module may be implemented in a form of hardware, or may be implemented in a form of a software functional module. For example, the encoding apparatus shown in FIG. 12, FIG. 15, or FIG. 16 may further include a transceiver module. The transceiver module is configured to implement communication between the encoding apparatus and another apparatus, for example, send N pieces of de-correlated encoded data, or receive a first parameter from the decoding apparatus. Similarly, the decoding apparatus shown in FIG. 12, FIG. 15, or FIG. 16 may further include a transceiver module. The transceiver module is configured to implement communication between the decoding apparatus and another apparatus, for example, receive M pieces of de-correlated encoded data, or send a first parameter to the encoding apparatus.

Figure 17:
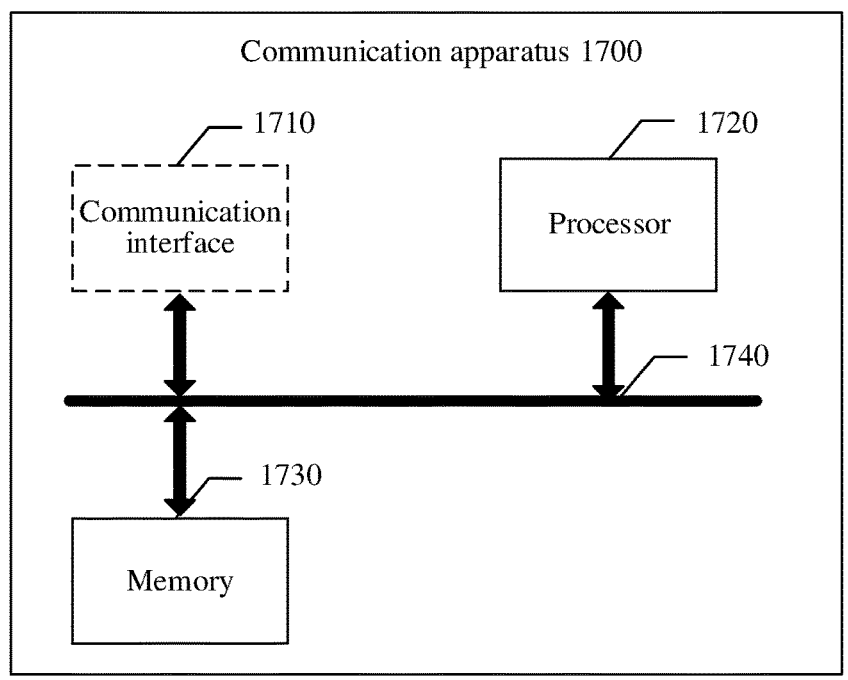
FIG. 17 is a schematic diagram of a structure of a communication apparatus according to an embodiment of this application.

FIG. 17 shows a communication apparatus 1700 according to an embodiment of this application. The communication apparatus 1700 may be the encoding apparatus in the embodiment shown in any one of FIG. 5, FIG. 6, FIG. 8, FIG. 12, FIG. 13, FIG. 15, or FIG. 16, and can implement a function of the encoding apparatus in the method provided in embodiments of this application. Alternatively, the communication apparatus 1700 may be an apparatus that can support the encoding apparatus in implementing a function of the encoding apparatus in the method provided in embodiments of this application. The communication apparatus 1700 may be a chip system. In this embodiment of this application, the chip system may include a chip, or may include a chip and another discrete component.

In hardware implementation, a transceiver is integrated into the communication apparatus 1700 to form a communication interface 1710.

The communication apparatus 1700 may include at least one processor 1720, configured to implement or support the communication apparatus 1700 in implementing the decoding apparatus in the method provided in embodiments of this application. For example, the processor 1720 may encode first data by using the encoding model to obtain N pieces of encoded data, and perform de-correlation on the N pieces of encoded data to obtain N pieces of de-correlated encoded data. For details, refer to detailed descriptions in the method example. Details are not described herein again.

The communication apparatus 1700 may further include at least one memory 1730, configured to store program instructions and/or data. The memory 1730 is coupled to the processor 1720. The coupling in this embodiment of this application may be an indirect coupling or a communication connection between apparatuses, units, or modules in an electrical form, a mechanical form, or another form, and is used for information exchange between the apparatuses, the units, or the modules. The processor 1720 may cooperate with the memory 1730. The processor 1720 may execute the program instructions stored in the memory 1730. At least one of the at least one memory may be included in the processor.

The communication apparatus 1700 may further include the communication interface 1710, configured to communicate with another device by using a transmission medium, so that an apparatus used in the communication apparatus 1700 can communicate with the another device. For example, the communication apparatus 1700 is an encoding apparatus, and the another device may be a decoding apparatus. The processor 1720 may send and receive data through the communication interface 1710. The communication interface 1710 may be specifically a transceiver.

A specific connection medium between the communication interface 1710, the processor 1720, and the memory 1730 is not limited in this embodiment of this application. In this embodiment of this application, the memory 1730, the processor 1720, and the communication interface 1710 are connected by using a bus 1740 in FIG. 17. The bus is represented by using a thick line in FIG. 17. A manner of connection between other components is merely an example for description, and is not limited thereto. The bus may be classified into an address bus, a data bus, a control bus, and the like. For ease of representation, only one thick line is used to represent the bus in FIG. 17, but this does not mean that there is only one bus or only one type of bus.

In this embodiment of this application, the processor 1720 may be a general-purpose processor, a digital signal processor, an application-specific integrated circuit, a field programmable gate array or another programmable logic device, a discrete gate or transistor logic device, or a discrete hardware component, and may implement or perform the methods, steps, and logical block diagrams disclosed in embodiments of this application. The general-purpose processor may be a microprocessor, any conventional processor, or the like. The steps in the methods disclosed with reference to embodiments of this application may be directly performed and completed by a hardware processor, or may be performed and completed by using a combination of hardware in the processor and a software module.

In this embodiment of this application, the memory 1730 may be a non-volatile memory, such as a hard disk (HDD) or a solid-state drive (SSD), or may be a volatile memory (volatile memory), such as a random access memory (RAM). The memory is any other medium that can carry or store expected program code in a form of instructions or a data structure and that can be accessed by a computer, but is not limited thereto. The memory in this embodiment of this application may alternatively be a circuit or any other apparatus that can implement a storage function, and is configured to store program instructions and/or data.

Figure 18:
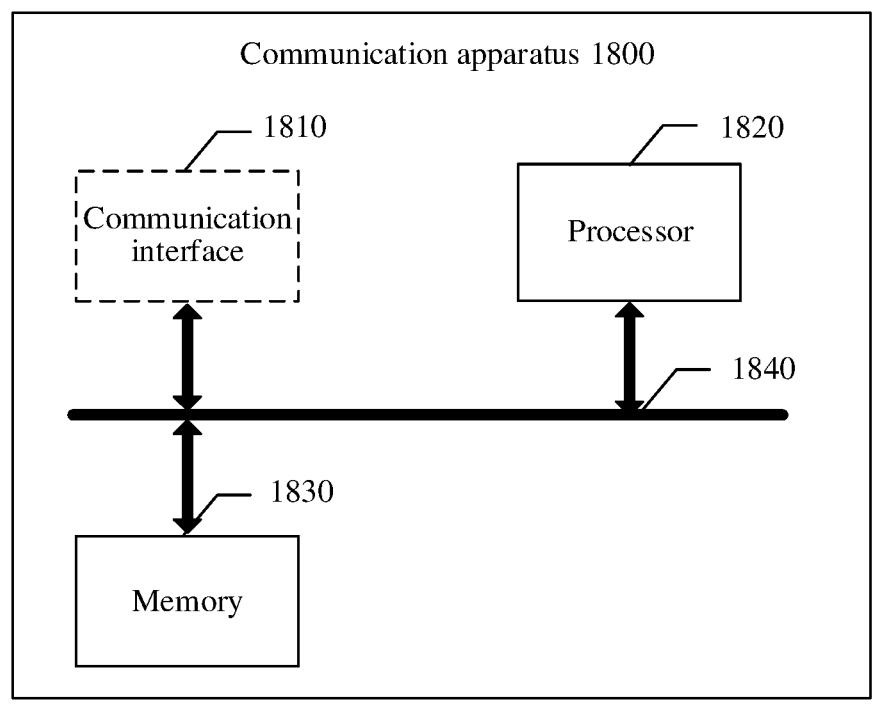
FIG. 18 is a schematic diagram of a structure of a communication apparatus according to an embodiment of this application.

FIG. 18 shows a communication apparatus 1800 according to an embodiment of this application. The communication apparatus 1800 may be the decoding apparatus in the embodiment shown in any one of FIG. 5, FIG. 10, and FIG. 12 to FIG. 16, and can implement a function of the decoding apparatus in the method provided in embodiments of this application. Alternatively, the communication apparatus 1800 may be an apparatus that can support the decoding apparatus in implementing a function of the decoding apparatus in the method provided in embodiments of this application. The communication apparatus 1800 may be a chip system. In this embodiment of this application, the chip system may include a chip, or may include a chip and another discrete component.

In hardware implementation, a transceiver is integrated into the communication apparatus 1800 to form a communication interface 1810.

The communication apparatus 1800 may include at least one processor 1820, configured to implement or support the communication apparatus 1800 in implementing the decoding apparatus in the method provided in embodiments of this application. For example, the processor 1820 may decode reconstructed N pieces of to-be-decoded data, to obtain second data, or the like. For details, refer to detailed descriptions in the method example. Details are not described herein again.

The communication apparatus 1800 may further include at least one memory 1830, configured to store program instructions and/or data. The memory 1830 is coupled to the processor 1820. The coupling in this embodiment of this application may be an indirect coupling or a communication connection between apparatuses, units, or modules in an electrical form, a mechanical form, or another form, and is used for information exchange between the apparatuses, the units, or the modules. The processor 1820 may cooperate with the memory 1830. The processor 1820 may execute the program instructions stored in the memory 1830. At least one of the at least one memory may be included in the processor.

The communication apparatus 1800 may further include the communication interface 1810, configured to communicate with another device by using a transmission medium, so that an apparatus used in the communication apparatus 1800 can communicate with the another device. For example, the communication apparatus 1800 is a decoding apparatus, and the another device may be an encoding apparatus. The processor 1820 may send and receive data through the communication interface 1810. The communication interface 1810 may be specifically a transceiver.

A specific connection medium between the communication interface 1810, the processor 1820, and the memory 1830 is not limited in this embodiment of this application. In this embodiment of this application, the memory 1830, the processor 1820, and the communication interface 1810 are connected by using a bus 1840 in FIG. 18. The bus is represented by using a thick line in FIG. 18. A manner of connection between other components is merely an example for description, and is not limited thereto. The bus may be classified into an address bus, a data bus, a control bus, and the like. For ease of representation, only one thick line is used to represent the bus in FIG. 18, but this does not mean that there is only one bus or only one type of bus.

In this embodiment of this application, the processor 1820 may be a general-purpose processor, a digital signal processor, an application-specific integrated circuit, a field programmable gate array or another programmable logic device, a discrete gate or transistor logic device, or a discrete hardware component, and may implement or perform the methods, steps, and logical block diagrams disclosed in embodiments of this application. The general-purpose processor may be a microprocessor, any conventional processor, or the like. The steps in the methods disclosed with reference to embodiments of this application may be directly performed and completed by a hardware processor, or may be performed and completed by using a combination of hardware in the processor and a software module.

In this embodiment of this application, the memory 1830 may be a non-volatile memory, such as a hard disk (HDD) or a solid-state drive (SSD), or may be a volatile memory (volatile memory), such as a random access memory (RAM). The memory is any other medium that can carry or store expected program code in a form of instructions or a data structure and that can be accessed by a computer, but is not limited thereto. The memory in this embodiment of this application may alternatively be a circuit or any other apparatus that can implement a storage function, and is configured to store program instructions and/or data.

The communication apparatus in embodiments of this application may be a vehicle-mounted device such as a head unit, an in-vehicle speaker, or an in-vehicle microphone, or may be an electronic device such as a mobile phone, a tablet computer, a desktop computer, a laptop computer, a notebook computer, an ultra-mobile personal computer (UMPC), a handheld computer, a netbook, a personal digital assistant (PDA), a wearable electronic device, or a virtual reality device. Alternatively, the communication apparatus in embodiments of this application may be a machine intelligent device, for example, a self-driving (self-driving) device, a transport safety (transportation safety) device, a virtual reality (virtual reality, VR) terminal device, an augmented reality (AR) terminal device, an MTC device, an industrial control (industrial control) device, a telemedicine (remote medical) device, a smart grid (smart grid) device, a smart city (smart city) device, a wearable device (such as a smart watch, a smart band, or a pedometer), or a smart home device. Alternatively, the communication apparatus in embodiments of this application may be a short-range communication device that supports a BT or a BLE technology, or is compatible with a BT or a BLE technology, or supports another possible short-range communication technology. Alternatively, the communication apparatus in embodiments of this application may be a functional module, for example, a chip system, disposed in any one of the foregoing devices.

An embodiment of this application further provides a computer-readable storage medium, including instructions. When the instructions are run on a computer, the computer is enabled to perform the method performed by the encoding apparatus or the decoding apparatus in the foregoing embodiments.

An embodiment of this application further provides a computer program product, including instructions. When the instructions are run on a computer, the computer is enabled to perform the method performed by the encoding apparatus or the decoding apparatus in the foregoing embodiments.

An embodiment of this application provides a chip system. The chip system includes at least one processor and an interface circuit. The processor is configured to execute instructions and/or data exchange through an interface circuit, an apparatus in which the chip system is located is enabled to implement a function of the encoding apparatus in the foregoing embodiments, or implement a function of the decoding apparatus in the foregoing embodiments. The chip system may include a chip, or may include a chip and another discrete component.

An embodiment of this application provides a communication system. The communication system includes the encoding apparatus and/or the decoding apparatus in the foregoing embodiments.

An embodiment of this application provides a terminal device. The terminal device includes the encoding apparatus and/or the decoding apparatus in the foregoing embodiments, or includes a chip system for implementing a function of the encoding apparatus and/or a chip system for implementing a function of the decoding apparatus.

All or some of the methods provided in embodiments of this application may be implemented by using software, hardware, firmware, or any combination thereof. When software is used for implementation, all or some of embodiments may be implemented in a form of a computer program product. The computer program product includes one or more computer instructions. When the computer program instructions are loaded and executed on the computer, the procedure or functions according to embodiments of the present invention are all or partially generated. The computer may be a general-purpose computer, a special-purpose computer, a computer network, a network device, a user equipment, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a digital video disc (DVD)), a semiconductor medium (for example, an SSD), or the like.

It is clearly that, a person skilled in the art can make various modifications and variations to this application without departing from the scope of this application. In this way, if these modifications and variations to this application fall within the scope of the claims of this application and their equivalent technologies, this application is also intended to cover these modifications and variations.

What is claimed is:

1. An encoding method, comprising:
   encoding first data by using an encoding model, to obtain N pieces of encoded data, wherein the encoding model is based on a convolutional neural network, an output layer of the encoding model comprises N nodes, each node outputs one of the N pieces of encoded data, and N is an integer greater than 2;
   performing de-correlation on the N pieces of encoded data to remove correlated characteristics between the N pieces of encoded data and to obtain N pieces of de-correlated encoded data, wherein the N pieces of de-correlated encoded data are uncorrelated, a part or all of the N pieces of de-correlated encoded data are for determining second data, the second data is for restoring third data, and the third data is the first data, or an approximation degree between the third data and the first data is greater than a specified threshold; and
   sending the N pieces of de-correlated encoded data.

2. The encoding method according to claim 1, further comprising:
   receiving a first parameter from a decoding apparatus, wherein the first parameter is a function of one or more parameters of a loss function, the loss function is for updating at least one of the encoding model or a parameter that is used in processing of the de-correlation, and the first parameter is determined by the decoding apparatus based on a peak signal-to-noise ratio between the first data and the third data.

3. The encoding method according to claim 2, further comprising:
   updating, based on first information, at least one of the encoding model or the parameter that is used in processing of the de-correlation, wherein the first information comprises at least one of the first parameter or a specified bandwidth resource.

4. The method according to claim 2, wherein the first parameter satisfies:

$$L_M = E[w_M * P_M],$$

wherein $L_M$ is the first parameter, $E[\cdot]$ is an expected value operation, $P_M$ is the peak signal-to-noise ratio between the first data and the third data, M is a quantity of pieces of the de-correlated encoded data used to determine the second data, $w_M$ is weights corresponding to different bandwidth resources, and M is an integer greater than 0 and less than or equal to N.

5. The encoding method according to claim 1, further comprising:
   before sending the N pieces of de-correlated encoded data, sending a pilot signal of the N pieces of de-correlated encoded data, wherein the pilot signal comprises a signal for determining channel state information of a channel between the encoding model and a decoding apparatus.

6. The encoding method according to claim 1, wherein performing de-correlation on the N pieces of encoded data to remove correlated characteristics between the N pieces of encoded data and to obtain N pieces of de-correlated encoded data comprises:
   performing non-linear transformation on characteristic information of the N pieces of encoded data, to obtain N pieces of non-linearly transformed characteristic information, wherein the non-linear transformation is based on a residual block model, and the characteristic information of the N pieces of encoded data is based on a plurality of characteristics of the N pieces of encoded data;
   determining a correlation coefficient matrix of the N pieces of encoded data based on the N pieces of non-linearly transformed characteristic information and the characteristic information of the N pieces of encoded data; and
   determining the N pieces of de-correlated encoded data based on the N pieces of non-linearly transformed characteristic information, the characteristic information of the N pieces of encoded data, and the correlation coefficient matrix.

7. The encoding method according to claim 1, wherein the N pieces of encoded data include first encoded data and second encoded data; and
   the performing de-correlation on the N pieces of encoded data to remove correlated characteristics between the N pieces of encoded data and to obtain N pieces of de-correlated encoded data comprises:
   determining correlated characteristic information between the first encoded data and the second encoded data based on characteristic information of the first encoded data and characteristic information of the second encoded data; and
   performing a difference operation on the characteristic information of the first encoded data and the correlated characteristic information between the first encoded data and the second encoded data to obtain de-correlated first encoded data.

8. A communication apparatus, wherein the communication apparatus comprises an encoder and a transceiver, and wherein:
the encoder is configured to:
encode first data by using an encoding model to obtain N pieces of encoded data, wherein the encoding model is based on a convolutional neural network, an output layer of the encoding model comprises N nodes, each node outputs one of the N pieces of encoded data, and N is an integer greater than 2; and
perform de-correlation on the N pieces of encoded data to remove correlated characteristics between the N pieces of encoded data and to obtain N pieces of de-correlated encoded data, wherein the N pieces of de-correlated encoded data are uncorrelated, a part or all of the N pieces of de-correlated encoded data are for determining second data, the second data is for restoring third data, and the third data is the first data, or an approximation degree between the third data and the first data is greater than a specified threshold; and
the transceiver is configured to send the N pieces of de-correlated encoded data.

9. The communication apparatus according to claim 8, wherein the transceiver is further configured to:
receive a first parameter from a decoding apparatus, wherein the first parameter is a function of one or more parameters of a loss function, the loss function is for updating at least one of the encoding model or a parameter that is used in processing of the de-correlation, and the first parameter is determined by the decoding apparatus based on a peak signal-to-noise ratio between the first data and the third data.

10. The communication apparatus according to claim 9, wherein the encoder is further configured to:
update, based on first information, at least one of the encoding model or the parameter that is used in processing of the de-correlation, wherein the first information comprises at least one of the first parameter or a specified bandwidth resource.

11. The communication apparatus according to claim 9, wherein the first parameter satisfies:

$L_M = E[w_M * P_M]$, wherein $L_M$ is the first parameter, $E[\cdot]$ is an expected value operation, $P_M$ is the peak signal-to-noise ratio between the first data and the third data, M is a quantity of pieces of the de-correlated encoded data used to determine the second data, $w_M$ is weights corresponding to different bandwidth resources, and M is an integer greater than 0 and less than or equal to N.

12. The communication apparatus according to claim 8, wherein the transceiver is further configured to:
before sending the N pieces of de-correlated encoded data, send a pilot signal of the N pieces of de-correlated encoded data, wherein the pilot signal comprises a signal for determining channel state information of a channel between the encoding model and a decoding apparatus.

13. The communication apparatus according to claim 8, wherein the encoder is configured to:
perform non-linear transformation on characteristic information of the N pieces of encoded data, to obtain N pieces of non-linearly transformed characteristic information, wherein the non-linear transformation is based on a residual block model, and the characteristic information of the N pieces of encoded data is based on a plurality of characteristics of the N pieces of encoded data;
determine a correlation coefficient matrix of the N pieces of encoded data based on the N pieces of non-linearly transformed characteristic information and the characteristic information of the N pieces of encoded data; and
determine the N pieces of de-correlated encoded data based on the N pieces of non-linearly transformed characteristic information, the characteristic information of the N pieces of encoded data, and the correlation coefficient matrix.

14. The communication apparatus according to claim 8, wherein the N pieces of encoded data include first encoded data and second encoded data; and
the encoder is configured to:
determine correlated characteristic information between the first encoded data and the second encoded data based on characteristic information of the first encoded data and characteristic information of the second encoded data; and
perform a difference operation on the characteristic information of the first encoded data and the correlated characteristic information between the first encoded data and the second encoded data to obtain de-correlated first encoded data.

15. A non-transitory computer-readable storage medium storing computer-readable instructions that, when executed on a communication apparatus, cause the communication apparatus to:
encode first data by using an encoding model to obtain N pieces of encoded data, wherein the encoding model is based on a convolutional neural network, an output layer of the encoding model comprises N nodes, each node outputs one of the N pieces of encoded data, and N is an integer greater than 2;
perform de-correlation on the N pieces of encoded data to remove correlated characteristics between the N pieces of encoded data and to obtain N pieces of de-correlated encoded data, wherein the N pieces of de-correlated encoded data are uncorrelated, a part or all of the N pieces of de-correlated encoded data are for determining second data, the second data is for restoring third data, and the third data is the first data, or an approximation degree between the third data and the first data is greater than a specified threshold; and
send the N pieces of de-correlated encoded data.

16. The non-transitory computer-readable storage medium according to claim 15, wherein the computer-readable instructions further cause the communication apparatus to:
receive a first parameter from a decoding apparatus, wherein the first parameter is a function of one or more parameters of a loss function, the loss function is for updating at least one of the encoding model or a parameter that is used in processing of the de-correlation, and the first parameter is determined by the decoding apparatus based on a peak signal-to-noise ratio between the first data and the third data.

17. The non-transitory computer-readable storage medium according to claim 16, wherein the computer-readable instructions further cause the communication apparatus to:

update, based on first information, at least one of the encoding model or the parameter that is used in processing of the de-correlation, wherein the first information comprises at least one of the first parameter or a specified bandwidth resource.

18. The non-transitory computer-readable storage medium according to claim 16, wherein the first parameter satisfies:

$L_M = E[w_M * P_M]$, wherein $L_M$ is the first parameter, $E[\cdot]$ is an expected value operation, $P_M$ is the peak signal-to-noise ratio between the first data and the third data, M is a quantity of pieces of the de-correlated encoded data used to determine the second data, $w_M$ is weights corresponding to different bandwidth resources, and M is an integer greater than 0 and less than or equal to N.

19. The non-transitory computer-readable storage medium according to claim 15, wherein the computer-readable instructions further cause the communication apparatus to:
perform non-linear transformation on characteristic information of the N pieces of encoded data, to obtain N pieces of non-linearly transformed characteristic information, wherein the non-linear transformation is based on a residual block model, and the characteristic information of the N pieces of encoded data is based on a plurality of characteristics of the N pieces of encoded data;
determine a correlation coefficient matrix of the N pieces of encoded data based on the N pieces of non-linearly transformed characteristic information and the characteristic information of the N pieces of encoded data; and
determine the N pieces of de-correlated encoded data based on the N pieces of non-linearly transformed characteristic information, the characteristic information of the N pieces of encoded data, and the correlation coefficient matrix.

20. The non-transitory computer-readable storage medium according to claim 15, wherein the N pieces of encoded data include first encoded data and second encoded data; and
the computer-readable instructions further cause the communication apparatus to:
determine correlated characteristic information between the first encoded data and the second encoded data based on characteristic information of the first encoded data and characteristic information of the second encoded data; and
perform a difference operation on the characteristic information of the first encoded data and the correlated characteristic information between the first encoded data and the second encoded data to obtain de-correlated first encoded data.

* * * * *